United States Patent [19]
Cheng

[11] Patent Number: 5,572,540
[45] Date of Patent: Nov. 5, 1996

[54] TWO-DIMENSIONAL OPTO-ELECTRONIC SWITCHING ARRAYS

[75] Inventor: Julian Cheng, Albuquerque, N.M.

[73] Assignee: University of New Mexico, Albuquerque, N.M.

[21] Appl. No.: 925,437

[22] Filed: Aug. 11, 1992

[51] Int. Cl.[6] .................... H01S 3/10; H01S 3/19
[52] U.S. Cl. .................... 372/50; 372/8; 372/38
[58] Field of Search ..................... 372/50, 8, 38

[56] References Cited

U.S. PATENT DOCUMENTS

| | | | |
|---|---|---|---|
| 4,910,571 | 3/1990 | Kasahara et al. | 372/50 |
| 5,206,872 | 4/1993 | Jewell et al. | 372/46 |
| 5,283,447 | 2/1994 | Olbright et al. | 257/85 |

*Primary Examiner*—James W. Davie
*Attorney, Agent, or Firm*—Milton D. Wyrick, Esq.

[57] ABSTRACT

The present invention pertains to electronically controlled optical switching and interconnection arrangements enabling generation and processing of optical pulses including rerouting, serializing, modulation, and other processing or transformation of such pulses.

33 Claims, 12 Drawing Sheets

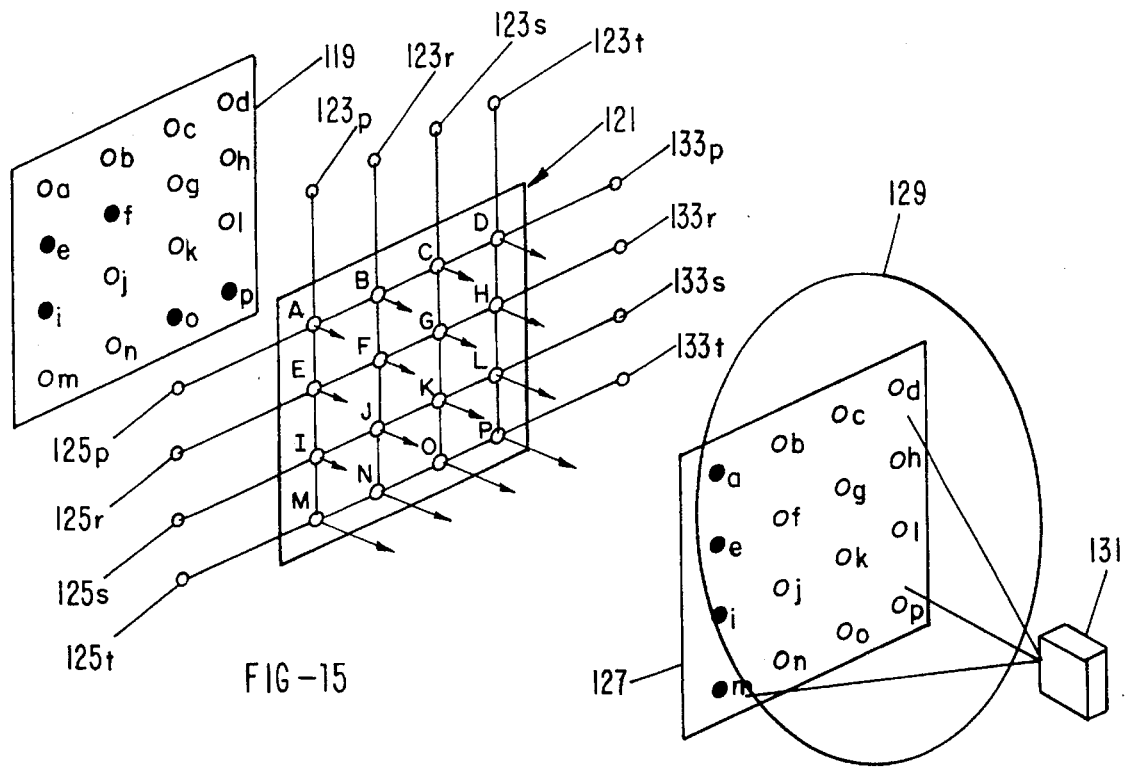
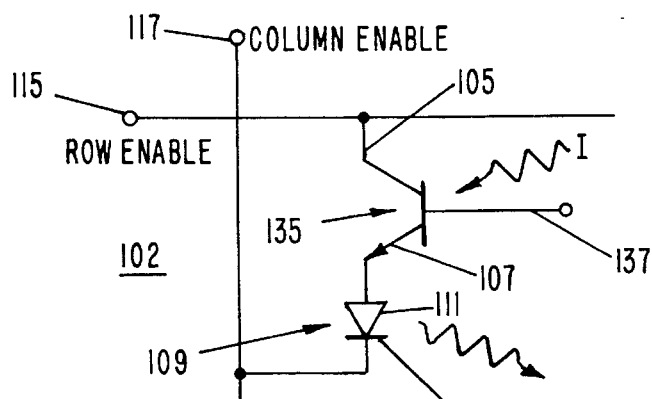
FIG-15A
FIG-16

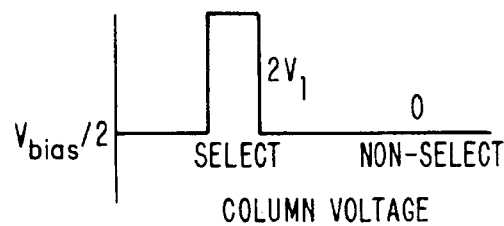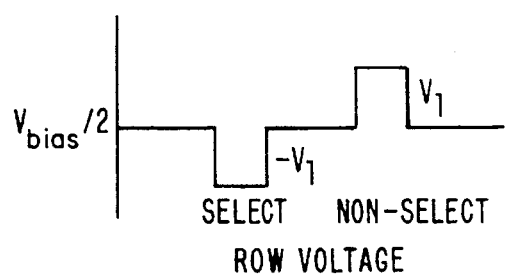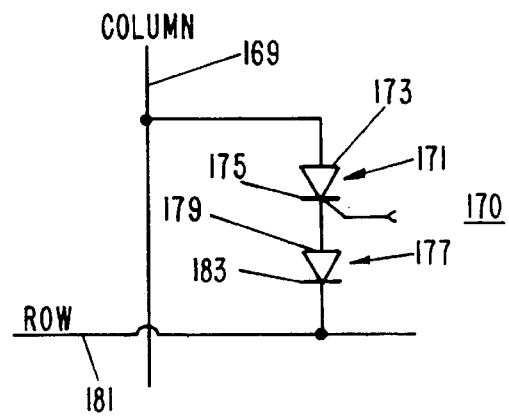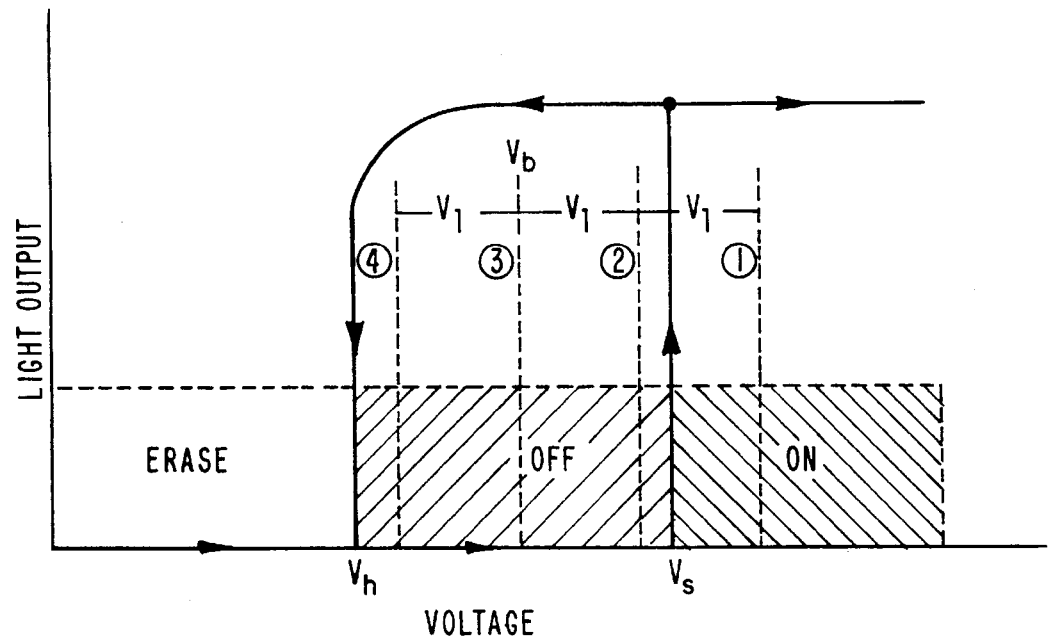
FIG-21
FIG-22
FIG-23

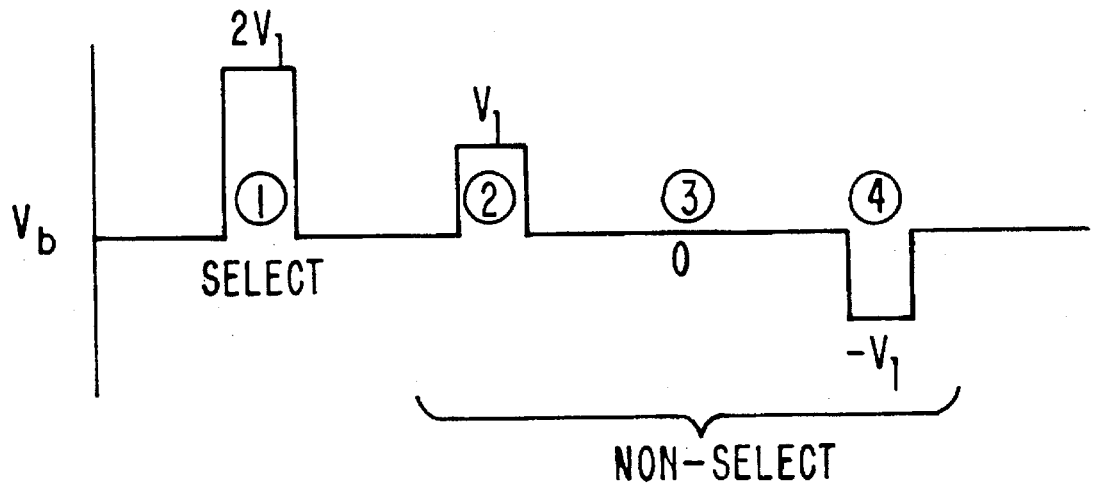
FIG-24
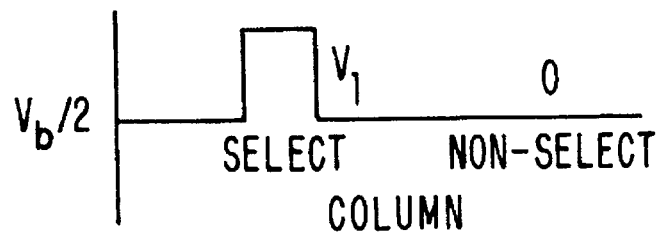
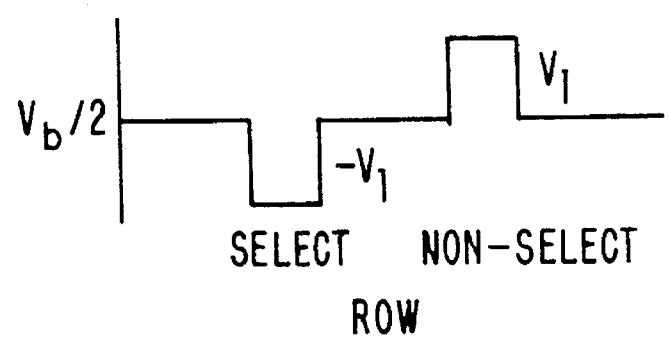
FIG-25

5,572,540

TWO-DIMENSIONAL OPTO-ELECTRONIC SWITCHING ARRAYS

FIELD OF THE INVENTION

The present invention is in the field of optical switching and more particularly, electronically controlled optical switching and interconnection arrangements enabling generation and processing of optical pulses including rerouting, serializing, modulation, and other processing or transformation of such pulses.

BACKGROUND OF THE INVENTION

Optical pulse or signal handling systems employing arrays are not of much use unless at each cross point thereof there is provided switching or reconfiguring of optical input signals so that they can be switched, changed, modulated, reconfigured, multiplexed, or otherwise transformed to provide optical output pulses in different arrangements as may be needed by system designers.

The capability to change—e.g., switch or reconfigure or selectively bypass/exchange optical paths or interconnections between elements in successive arrays of elements is important for the routing of data to different processors in optical pipeline structures and in digital cross-connect switching ("DACS") operations in optical communications, where N×N cross bar or cross point switching is need to route data to different locations.

A significant problem associated with optical interconnection systems is the space required to bend light beams or fiberoptics around corners. In large scale optical data processing systems, this space problem can be formidable. This problem is overcome by the present invention which affords substantial space-saving in optical interconnection and switching systems.

SUMMARY OF THE INVENTION

The present invention provides a very compact electrooptical switching arrangement having switch elements or nodes which are sensitive not only to the intensity of optical energy but also to one or more electrical variables such as bias or switch control voltages. That is, optical signals can be rerouted under control of electrical signals such as bias control voltages. Thus, a plurality of switch elements or nodes arranged in accordance with the invention can switch or reconfigure, i.e., bypass or exchange, the optical paths between elements of an array. This can enable selective rerouting or modulation of optical signals to different locations in space and/or time including parallel to serial and analog to digital conversions.

In one version each switching or bypass/exchange element at a crosspoint of an array may comprise an appropriately biased vertical cavity surface emitting laser (VCSEL). In another version a switching node comprising one or a pair of appropriately biased heterojunction phototransistors (HPT) may be electrically connected for control of a suitably biased VCSEL. In yet another version, each crosspoint switch of an array may constitute a latching element comprising a photothyristor in combination with a VCSEL.

According to the invention optical connections or paths in a first array can be reconfigured to exist in a different set of elements of one or more further arrays. In another embodiment, cross point elements each having multiple bias controls serve to reorder, digitize, or modulate incoming parallel channel optical signals to produce a time division multiplexed output thereof.

Advantageously, the electro-optical nodes and switches afforded by the present invention enable very compact arrangements of optical interconnection systems, reducing space requirements for optical integrated circuits by as much as an order of magnitude or more.

A feature of the invention is the provision of a pair of coacting chip arrays on two adjacent planes in near intimate contact with each other. This is referred to herein as a coplanar or biplanar chip. In accordance with the invention the optical elements of one chip array produce optical outputs which serve as optical inputs to the switching elements of the other chip array. and vice versa, so that any number of switching or rerouting stages may be provided with the use of only two layers or planes of optically interacting chip arrays.

BRIEF DESCRIPTION OF THE DRAWINGS

Reference is now made to the drawings in which like reference numerals refer to like parts and in which

FIG. 6 is a view in cross section through A—A of FIG. 5 showing further structural detail of an optical binary switch in accordance with an embodiment of the invention.

FIG. 15 is an optical switching system in accordance with another embodiment of the invention, FIG. 15A is a schematic circuit diagram of crosspoint node with modified biasing in accordance with another embodiment of the invention;

FIGS. 16 and 17 are graphs of pulse trains explaining the operation of the system shown in FIGS. 15 and 15A.

FIGS. 19–21 are graphs for use in explaining the operation of the embodiment of FIG. 18;

FIG. 22 is a schematic circuit diagram of a cross point switch in according to another embodiment of the invention, and FIGS. 23–25 are graphs explaining the operation of the embodiment shown in FIG. 22.

DETAILED DESCRIPTION OF THE INVENTION

Figure 1:
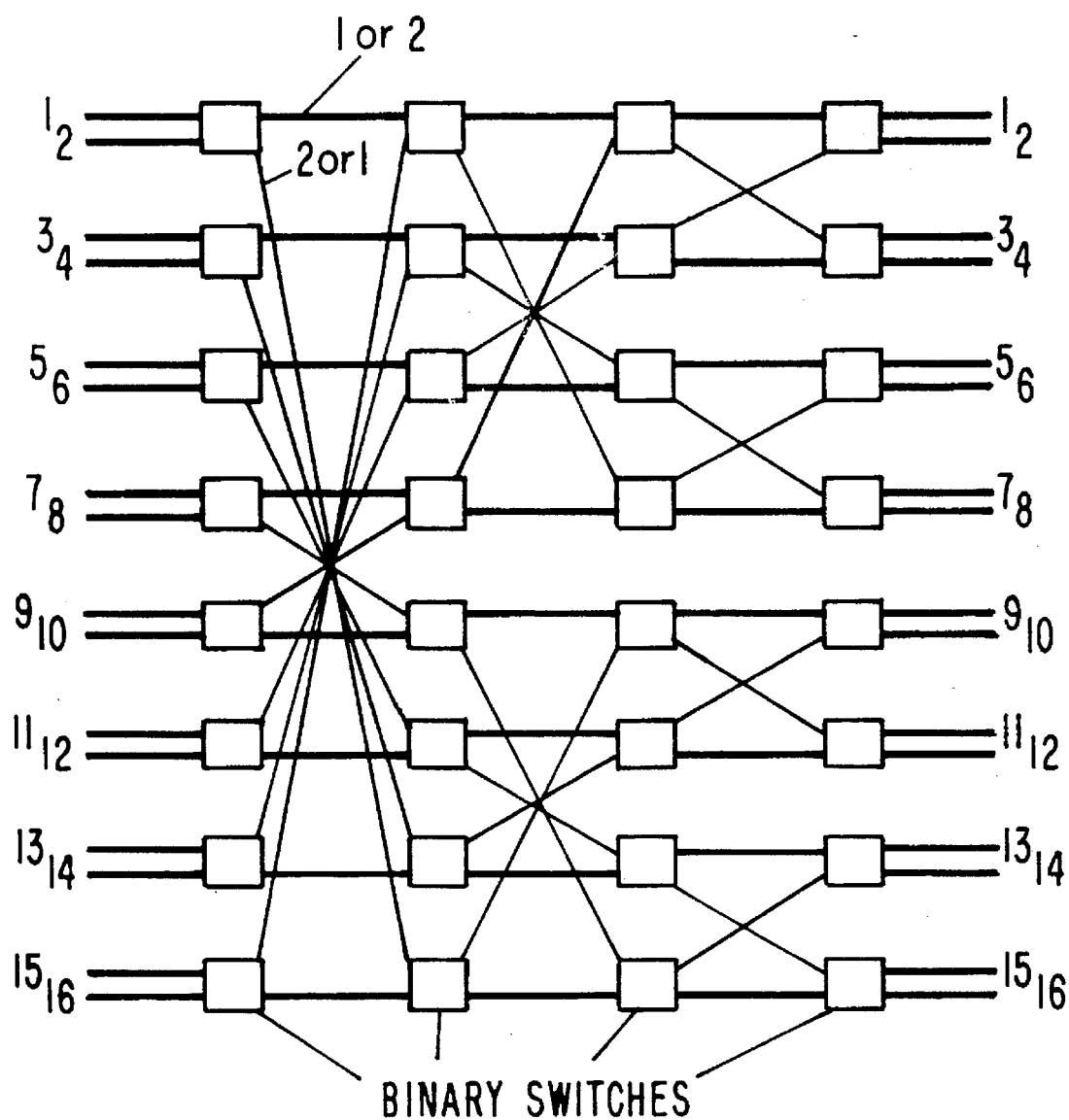
FIG. 1 is a schematic diagram of a crossover interconnection system employing optical switches in accordance with an embodiment of the invention.

Referring to FIG. 1, there is illustrated a planar crossover type optical interconnection system for which the binary optical switching arrangement in accordance with one embodiment of the invention is particularly useful. The system in FIG. 1 has 16 optical inputs arranged in pairs, 1,2, and 3,4, etc., and further comprises four banks or rows a, b, c, and d of bypass/exchange optical switches or elements 11, each of which comprises an embodiment of the invention and will be explained in more detail in connection with FIGS. 2–5. The input pairs 1,2, and 3,4, etc., are fed to respective optical bypass/exchange switches in row a. In accordance with the invention, each bypass/exchange switch 11 has the capability to reconfigure the paths of the input signals so that, for example, the optical inputs 1 and 2 to the first switch in row a may exit the switch with their positions either unchanged, i.e., bypassed, or exchanged, so that the input signal that entered the switch in pair position 1 leaves that switch either unaltered or bypassed in position 1 or altered or exchanged in pair position 2. As shown in FIG. 1, 32 switches are necessary to enable the 16 different incoming signals to be switchable via rows a, b, and c to any one of 16 different outputs in row d.

Figure 2:
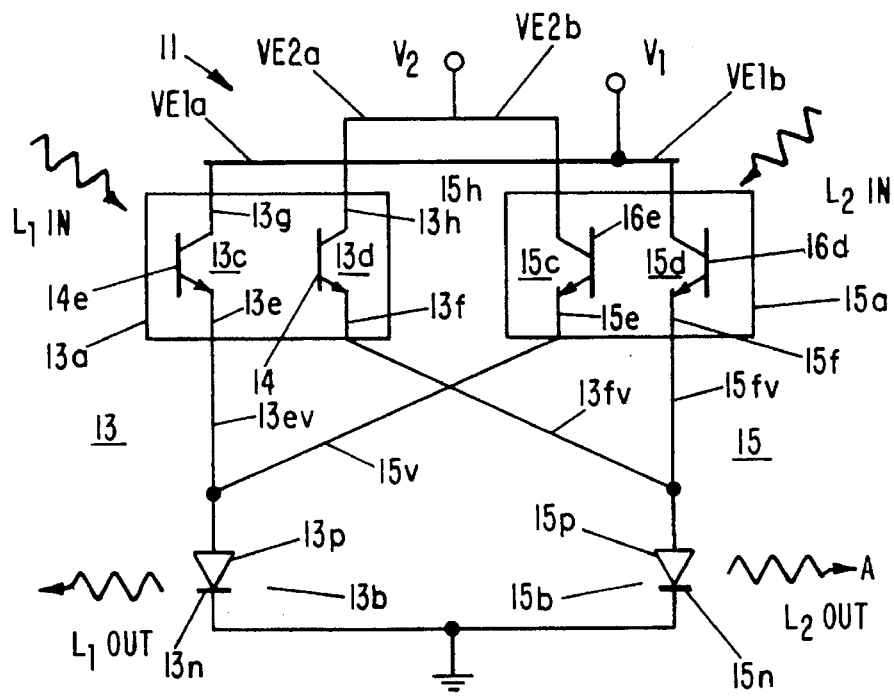
FIG. 2 is a schematic diagram of an optical switch and its constituent nodes in accordance with an embodiment of the invention.

The bypass/exchange optical switch 11 in accordance with the invention is shown schematically in FIG. 2 and comprises two identical nodes 13 and 15 with node 13 having an input section 13a receiving or detecting optical signal $L_1$ and an output section 13b for transmitting either $L_1$ or $L_2$ signals. The node 15 has an input section 15a receiving optical signal $L_2$ and an output section 15b for transmitting either $L_1$ or $L_2$ signals. The input section 13a comprises a pair of heterojunction phototransistors (HPT) 13c and 13d, and the input section 15a has a pair of HPTs 15c and 15d. Each of the output sections is comprised of respective vertical cavity surface emitting lasers (VCSELs) 13b and 15b having respective p-doped terminals or portions 13p and 15p and respective n-doped output terminals or portions 13n and 15n.

The HPT 13c has its emitter 13e connected to the p-doped portion 13p of the VCSEL 13b via a conduit 13ev. The emitter 13f of the HPT 13d is connected to the p-doped portion 15p of the VCSEL 15b via a conduit 13fv. The emitter 15e of the HPT 15c is connected to the p-doped portion 13p of VCSEL 13b via a conduit 15ev, and the emitter 15f of the HPT 15d is connected to the p-doped portion 15p of VCSEL 15b via a conduit 15fv.

A first source of d.c. bias control voltage V1 is connected to an electrode VE1a abutting collector 13g of HPT 13c and an electrode VE1b abutting the collector 15g of HPT 15d. A second source of d.c bias control voltage V2 is connected to an electrode VE2a abutting collector 13h of HPT 13d and to an electrode VE2b abutting collector 15h of HPT 15c. The base portions of each of the HPTs are identified respectively as 14c for HPT 13c, 14d for HPT 13d, 16c for HPT 15c, and 16d for HPT 15d.

In accordance with well known principles of operation of HPTs, normally when the optical energy or signal such as $L_1$ impinges on the HPT 13c or 13d, current flows from the emitters 13e and 13f which produce an amplified version of the input optical energy or signal $L_1$. Similarly, when $L_2$ impinges on HPTs 15c and 15d, normally current representing an amplified version of the input $L_2$ will flow from emitters 15e and 15f. However, in accordance with the invention, the output current produced by the HPTs due to impingement of $L_1$ or $L_2$ thereon is insufficient by itself to bias each of the VCSELs 13b and 15b to their "on" conditions. Alternatively, the set-up, e.g., the bias or "prebias" of the HPTs may adjusted in any suitable well known manner so that no current from the emitters 13e, 13f, 15e, and 15f is present unless the bias or "prebias" is present. In any event, when either of the VCSELs 13b and 15b has sufficient bias voltage on respective p-doped terminals 13p and 15p, they will be energized to their "on" conditions. When either VCSEL 13b or 15b is turned "on", each will emit optical energy or signals B or A representing amplified replicas of the optical input signals, either $L_1$ or $L_2$, reaching its p-doped input terminal.

In accordance with the invention the operating point of the VCSEL in each output node 13b and 15b is made to depend not only on the voltage bias on its P-doped portions 13p and 15p but also on the photo-current produced by the bias voltage sources V1 and V2 which act as the control voltages operating nodes 13 and 15 as optical bypass/exchange switches. This is explained further in connection with FIGS. 3 and 4, to which reference is now made.

Figure 3:
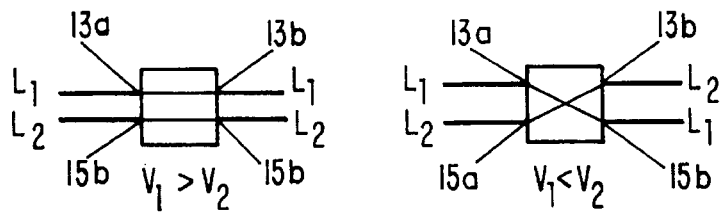
FIG. 3 is a schematic diagram illustrating the switching action of each of the switching nodes shown in FIG. 2.

As shown in the simplified schematic of FIG. 3, when the bias voltage V1 exceeds V2, the input signals $L_1$ and $L_2$ remain in their respective nodes 13 and 15 and are emitted from their respective VCSELs in output sections 13b and 15b. In short, the condition V1 greater than V2 means that $L_1$ and $L_2$ are not exchanged or switched from their respective nodes 13 and 15. However, when V2 exceeds V1, as indicated in the right hand illustration of FIG.3, the signals $L_1$ and $L_2$ are exchanged or switched so that $L_1$ entering node 13 is emitted 38 from output node 15b and $L_2$, entering node 15, from the output section 13b.

Figure 4:
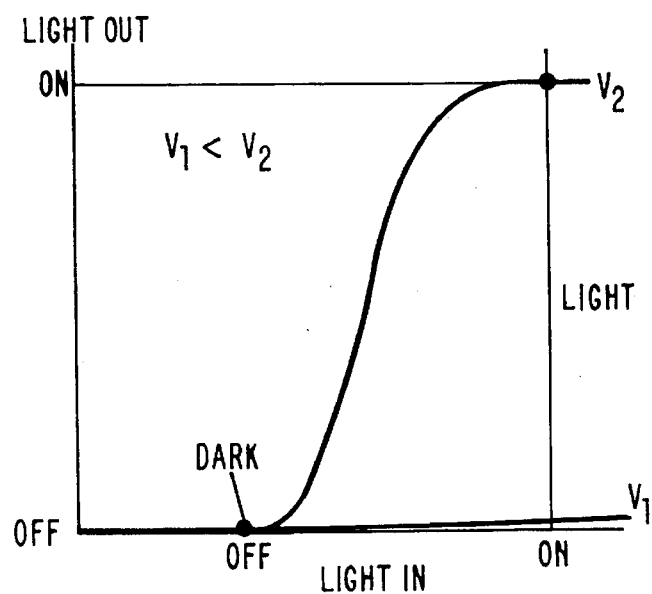
FIG. 4 is a graph of applied voltage versus light for the optical switch shown in FIG. 2.

The switching or exchange occurs because, as shown in the graph of FIG. 4 which illustrates the values of the voltages V1 and V2 when the binary switch is in its switching or rerouting mode, V1 is too low to enable sufficient current from emitters 13e and 15f of HPTs 13c and 15d to bias the VCSELs 13b and 15b to their "on" conditions. However, V2 is sufficiently high to provide enough current from emitters 13f and 15e of HPTs 13d and 15c to turn on the VCSELs 13b and 15b, whereby in the VCSEL 13b of node 13, an amplified replica of $L_2$ will be emitted, and likewise, in section 15b of node 15, an amplified replica of $L_1$ will be transmitted from the VCSEL 15b. Thus, the signals $L_1$ and $L_2$ are switched, i.e., $L_1$ is emitted from the path in which $L_2$ is normally present, and $L_2$ is emitted from the path in which $L_1$ is normally present.

When the bias voltage from source V1 exceeds V2, i.e., when the positions of V1 and V2 in the graph of FIG. 4 are reversed, the current from emitter 13e on HPT 13c will be sufficiently large to activate the VCSEL 13b in node 13, thereby enabling an amplified replica of optical signal $L_1$ to be emitted from the VCSEL 13b. However, the bias voltage V2 is too low to enable enough current from emitter 13f of HPT 13d to activate the VCSEL 15b. Therefore, the VCSEL 15b is unable to emit an amplified replica of $L_1$.

Similarly, in node 15, the optical signals $L_2$ reaching HPT 15d are aided by the bias voltage V1 to enable sufficient current from emitter 15f to turn on the VCSEL in output section 15b. Thus, an amplified replica of the signal $L_2$ is emitted from the VCSEL 15b in node 15.

Consequently, it is seen that switching, i.e., rerouting or reconfiguring of the binary optical switch of the invention, depends not only on the input optical energy conditions, but also on conditions of the bias voltages V1 and V2. This arrangement provides important control and space-saving advantages in the utilization of the binary optical switch elements and nodes of the invention.

Figure 5:
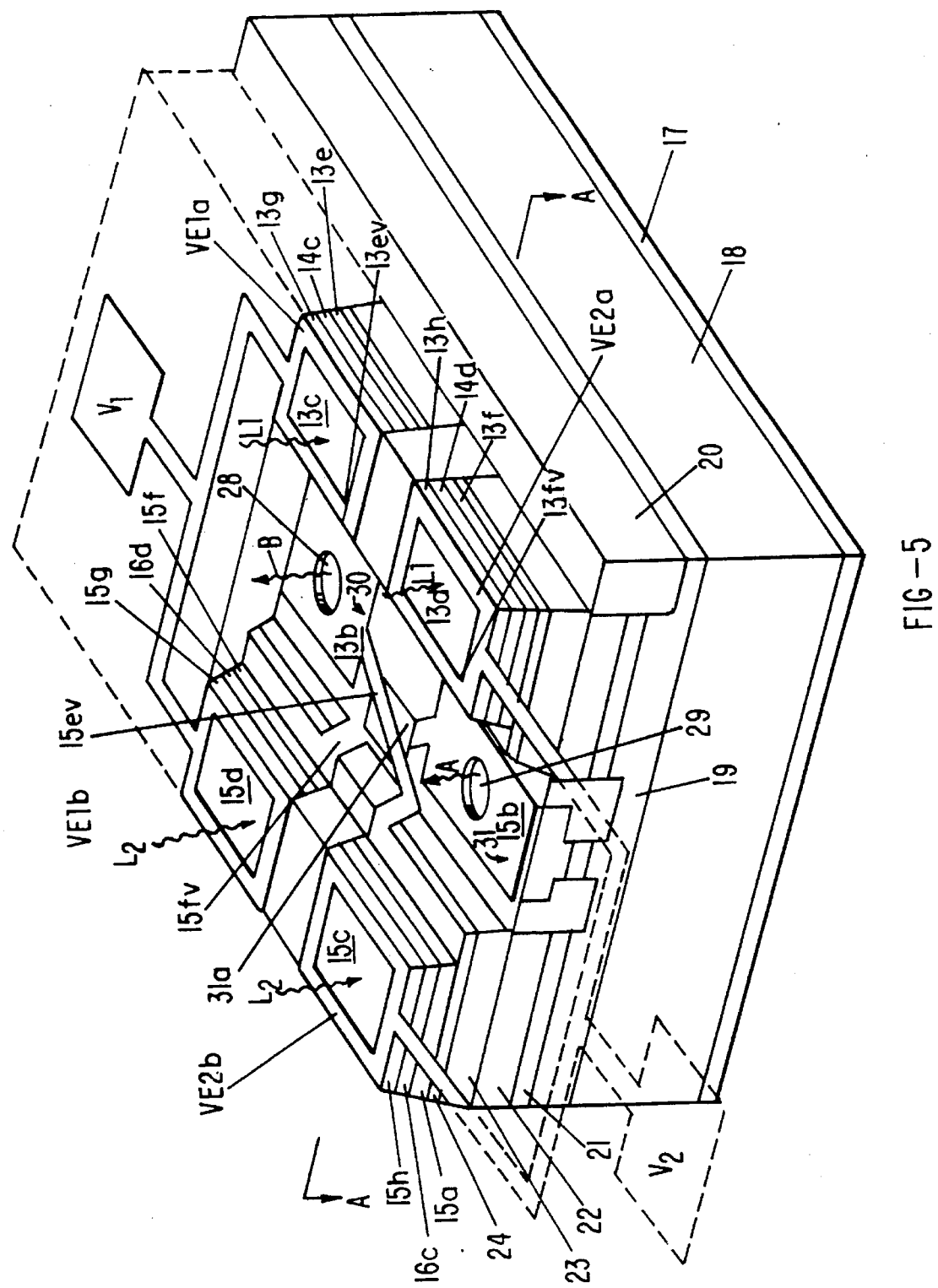
FIG. 5 is a simplified view of an optical switch composite integrated structure in accordance with an embodiment of the invention.

The integrated structure of an embodiment of the binary optical switch 11 of the invention is shown functionally in FIG. 5 and includes, from the bottom up, a ground plane 17, and an n+ substrate layer 18, and an n+ multilayer reflector layer 19. One or more proton implant isolation portions 20 partially overlies one end of the layer 19. Elsewhere, an active layer 21 separates the n+ layer from a p+ multilayer reflector layer 22. The proton implant isolation portion 20 also overlies layers 21 and 22. An isolation layer 23 overlies the p+ layer.

The devices integrated onto the foregoing structure and which comprise part of the nodes 13 and 15 respectively include HPTs 13c and 13d and VCSEL 13b and HPTs 15c, 15d, and VCSEL 15b, all isolated from each other by one of the proton implant isolation portions 20. The HPTs 13c, 13d, 15c, and 15d are identical to each other and each has an underlying n+ contact layer 24. Each HPT consists of identical layers, from the bottom up, identified as follows for the HPT 13c: an n emitter layer 13e, p base layer 14c, and n collector layer 13g; for the HPT 13d: emitter layer 13f, base layer 14d, and collector layer 13h; for HPT 15c: emitter layer 15e, base layer 16c, and collector layer 15h, and for HPT 15d, emitter layer 15f, base layer 16d, and collector layer 15g. The VCSELs 13b and 15b are respectively located between HPTs 13d, 15c and 13c, 15d.

The VCSELs and HPTs are isolated from each other by one of the proton implant portions 20. The VCSELs 13b and 15b are characterized by laser emitting window portions 28 and 29 in respective p– metallic contact layers 30 and 31. Metallic contact 30 of VCSEL 13b is connected by conductor 15ev to the n+ substrate of HPT 15c thus providing a conductive path from emitter 15e to p-doped layer 15p of VCSEL 13b. The metallic contact 31 of VCSEL 15b is connected by conductor 13fv to the n+ substrate of HPT 15d, thus providing a conductive path between emitter 15f and p-doped layer 15p. The conductive strips 13fv and 15ev are insulated from each other by a pad 31a. The n+ substrate for HPT 13c is connected in a similar manner to VCSEL 13b by conductor 13ev(shown in broken line in FIG. 5), thus effectively connecting emitter 13e to p-doped layer 13p. The n+substrate for HPT 13d is connected to VCSEL 15b by conductor 13fv (shown in broken line), thus effectively connecting emitter 13f to p-doped layer 15p. As shown in FIG. 5 paths 15fv and 15ev overlie each other and are separated by insulator pad 31a.

The source of bias voltage V1 is connected via conductive strips located on the proton implant isolation to HPTs 13c and 15d, and bias voltage source V2 in a similar manner to HPTs 13d and 15c.

The composite structure is electrically energized by applying ground potential to the ground plane 17, by applying radiation such as optical energy indicated as $L_1$ and $L_2$ to the surfaces of HPTs 13c, 13d, 15c, 15d, and by applying a selected one of the positive dc bias control voltages V1 to the metal electrodes VE1a, VE1b, or V2 to metal electrodes VE2a, or VE2b. In response to the optical energy $L_1$ and $L_2$ of appropriate threshold-surpassing energy impinging on the HPTs, the impedance of the HPTs is reduced allowing passage of current from either V1 or V2, depending on which of V1 or V2 is energized, through certain of the HPTs, to the p-junctions 13p and 15p of VCSELs 13b and 15b.

As explained earlier in connection with FIGS. 2, 3, and 4, if optical energy or signals $L_1$ and $L_2$ impinge on the HPTs, and if, say, V2 is turned on to a sufficient bias level (V2 thus greater than V1), sufficient current will be passed via HPTs 13d and 15c to bias the p-junctions 15p and 13p respectively to energize the VCSELs in the opposite nodes to a lasing condition the on-off condition of which will correspond to input signals $L_1$ and $L_2$. That is, in node 13 the HPT 13d will be turned on by the energy of $L_1$ plus V2 causing an electrical signal which is an amplified replica of $L_1$ to be generated in HPT 13d and passed from collector 13f via path 13fv to p-junction 15p of VCSEL 15b biasing that VCSEL to its "on" condition in node 15 to lase at times replicating input signal $L_1$. Similarly, with V2 energized, HPT 15c will be turned on by the energy of $L_2$ plus V2 to enable an electrical signal which is an amplified replica of L2 to be fed via collector 15e and path 15ev to the p-junction 13p of VCSEL 13b, causing that VCSEL to lase and produce a signal corresponding to $L_2$. Of course, because the bias level of V1 is too low, the HPTs 13c and 15d will not be energized sufficiently to bias the VCSELs in their own respective nodes 13 and 15 despite the presence of incoming energy from $L_1$ and $L_2$. Thus, $L_1$ will not be passed straight through its node 13, and $L_2$ will not be passed straight through its node 15. That is, as discussed in connection with FIG.2, the paths for $L_1$ and $L_2$ under the foregoing condition are effectively reconfigured or switched so that L1, entering node 13, is switched over to node 15, while L2, entering node 15, is switched over to node 13.

Referring further to FIG. 5 and also to FIG. 6 which is a cross section of the embodiment of FIG. 5 in the plane A—A looking in the direction from V1 towards V2, the detailed composite integrated circuit structure of HPT 13d (identical to all of the other HPTs) and the VCSEL 15b (identical to VCSEL 13b) is shown.

Overlying the ground plane 17 is the substrate 18 which consists of n+ gallium arsenide (GaAs) on which is formed an n GaAs buffer layer 18a. The multi reflector layer 19 comprises a series of semiconductor mirror layers epitaxially grown on buffer layer 18a, and these are constituted of n type aluminum arsenide (AlAs)/n type aluminum gallium arsenide (AlGaAs) films.

Atop layer 19 is the active layer 21 consisting of active layers 32–35 and spacer layers 37–41 forming quantum wells of VCSEL 15b, shown on the right hand side of the drawing. In the VCSEL 15b, the active layers 32–35 are spaced from each other by the spacer layers 37–41, and these layers are surrounded by the ringlike proton implanted region 20. Region 20 is formed by bombarding an annular region of layers 32–41 with hydrogen (H+) ions.

The next layer, multi-reflector layer 22, consists of a series of semiconductor films 44 forming a passive semiconductor mirror constituted of successive films of p-AlAs/p-AlGaAs. The films 44 overlie the quantum wells in the VCSEL. Isolation layer 23 comprises two layers 50 and 52 deposited in sequence on the top surface of mirror films 44 on the left side of the drawing. Layer 50 is an undoped aluminum arsenide stop-etch layer, and layer 52 is a relatively thick undoped gallium arsenide layer deposited on layer 50. The n+ contact layer 24, formed of n+ GaAs, is deposited on layer 52, and the layers 50, 52, and 56 form an isolation p-i-n diode.

The HPT 13d shown on the left side of the drawing is formed on the contact layer 56 and is constituted of an n-AlGaAs emitter layer 58 a p+ GaAs base layer 60, and an n-type GaAs collector layer 62. An N-type ohmic metal film 64 is deposited on layer 56 simultaneously with deposition of metal anode film on the uppermost n-doped GaAs contact layer 66 of the HPT 13d. A p-type contact metal film 31 is deposited on the upper surface of p-AlAs/p-ALGaAs semiconductor mirror 44. The metal conductor VE2b from bias source V2 is deposited on the layer 66.

Figure 7:
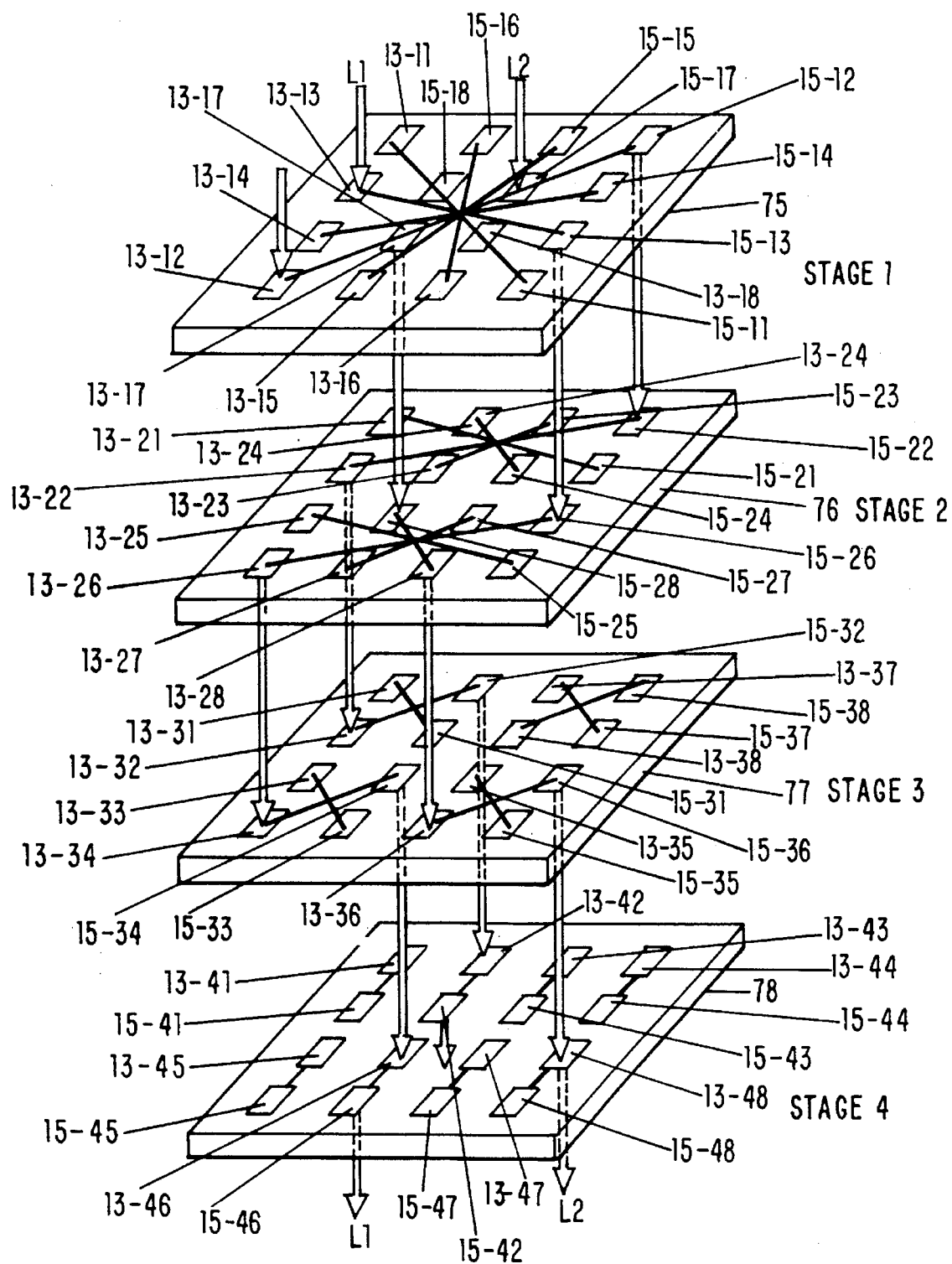
FIG. 7 is a view of a three dimensional multistage optical switching network or system in accordance with an embodiment of the invention.
Figure 7:
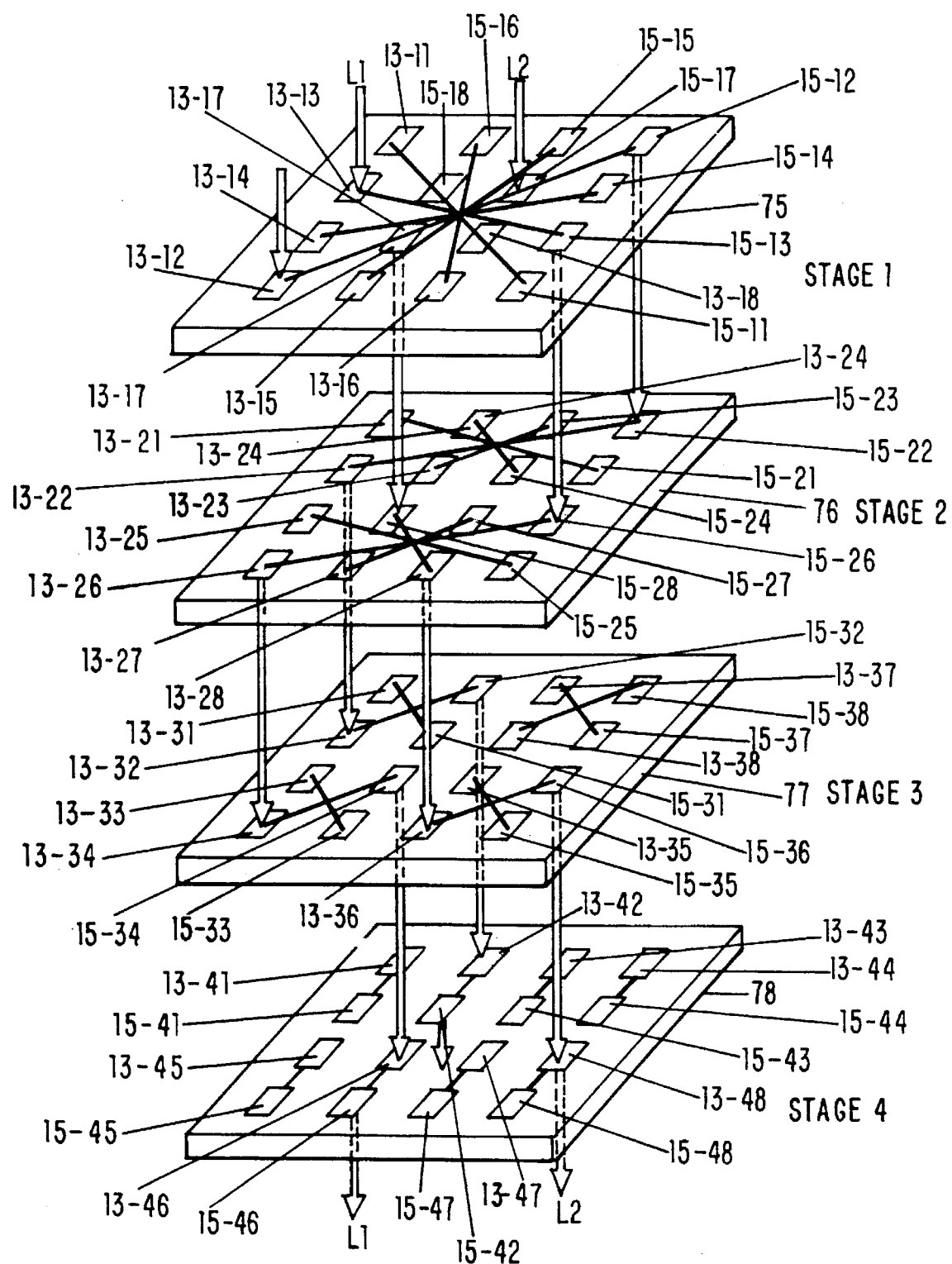

Referring to FIG. 7, there is shown an optical crossover interconnection or switching system in which there is exploited the capability of single node (i.e., a node 13 or a node 15 shown in FIG. 2) to direct energy replicating the input optical energy indicated as $L_1$ and $L_2$ either bypassed or exchanged in accordance with the application of the appropriate bias voltage.

Figure 7A:
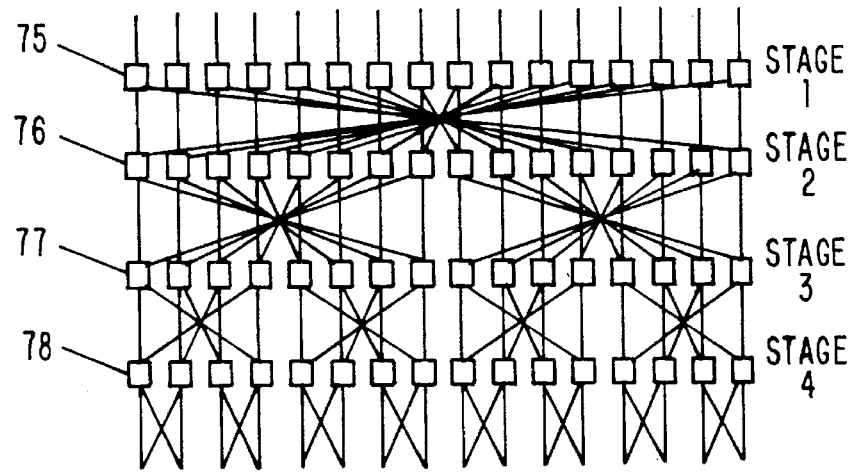
FIG. 7A is a two dimensional representation of the optical switching network shown in FIG. 7.

In FIG. 7 there is illustrated a 16×16 connection switch array of the crossover type utilizing the bypass/exchange optical switch of the invention discussed in connection with FIG. 2, but with the nodes 13 and 15 of each of a plurality of bypass/exchange optical switches being separated from each other on the array. The array is constituted of first, second, third, and fourth planar arrays or switching stages respectively identified as 75, 76, 77, and 78. A two dimensional representation of the array of FIG. 7 is shown in FIG. 7A to facilitate understanding. For purposes of illustration, the planar arrays 75, 76, 77, and 78 are shown substantially spaced apart. In reality, these planar arrays are intended to be in very close proximity to each other in accordance with the invention, i.e., less than one micron spacing.

Figure 8:
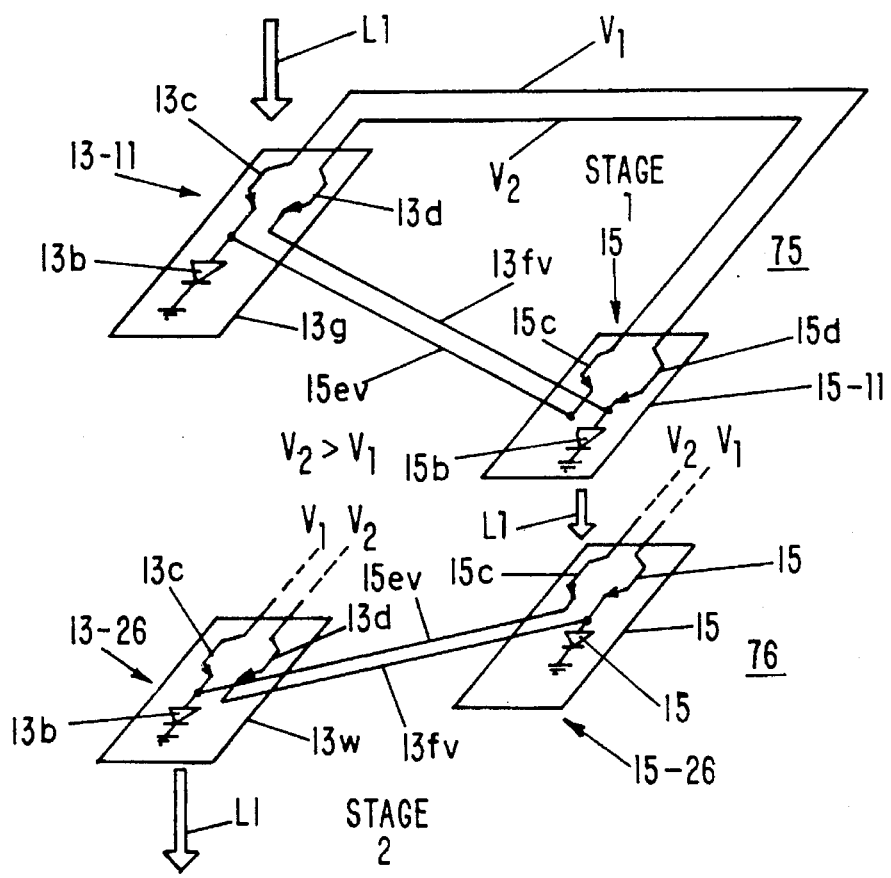
FIG. 8 is a schematic diagram of a group of optical switch nodes in accordance with an embodiment of the inventions.

In each stage or planar array 75, 76, 77, and 78, a plurality of nodes such as 13 and 15 discussed in connection with FIG. 2 are spaced apart from, but electrically connected to, each other, as shown in FIG. 8, to provide the cross over points in each of the network stages.

Thus, in stage 1, indicated by the reference numeral 75, one node 13-11 of a pair of nodes comprising a binary switch is located (imagining that the top of the drawing is "north") at the northwest corner of stage 1 while the other node 15-11 of that pair is located at the opposite or southeast corner. Similarly, another node 13-12 of a pair is located at the southwest corner while its companion node 1512 is located at the northeast corner. Another node 13-13 adjacent node 13-11 in the NW corner is connected to its opposing companion 15-13 in the southeast corner. In like manner, the other pairs of nodes 13-14 and 15-14; 13-15 and 15-15; 13-16 and 15-16; 13-17, and 13-18 and 15-18 are similarly connected in diametrically opposing pairs, following the pattern for stage 1 of a crossover network such as is shown in FIG. 1.

The connections of the pairs of nodes in second stage 76 are in "northern" and "southern" groups of 4 pairs of nodes in each group. Here, in the northern group node 13-21 of a first pair is at the northwest corner and is connected to its companion node 15-21 at the southeast corner of the northern group. Likewise, an adjacent node 13-22 in the northern group is connected to its opposing companion node 15-22 in that group, and so on, for pairs 13-23 and 15-23; 13-24 and 15-24. In the southern group of stage 2 (reference numeral 76) the node pairs 13-25 and 15-25; 13-26 and 15-26; 13-27 and 15-27, and 13-28 and 15-28 are likewise connected as indicated.

In the third stage 77, following the recipe for the crossover network shown in FIG. 1, the nodes are arranged in four sets of four opposing nodes in each set at the NW, SW, NE, and SE corners of the array. Thus, in the set of opposing nodes in the northwest corner of stage 3, node 13-31 at the NW corner is connected to its companion node 15-31 located toward the center of the array, while nodes 13-32 and 15-32 of the same set are connected to each other across the NW corner. Similarly, in each corner proceeding counter clockwise, in the SW corner there are node pairs 13-33 and 15-33 plus 13-34 and 15-34; in the SE corner, there are pairs 13-35, 15-35 plus 13-36 and 15-36, and in the NE corner there are pairs 13-37 with 15-37 and 13-38 with 15-38.

In the fourth stage 78, the nodes are arranged in adjacently connected pairs in northern and southern groups, the pairs in the northern group being 13-41 with 15-41, 1342 with 15-42, 13-43 with 15-43, and 13-44 with 15-44. In the southern group there are pairs 13-45 with 15-45, 13-46 with 15-46, 13-47 with 15-47, and 13-48 with 15-48.

Thus it is seen in FIG. 7 that all of the electrical connections for the nodes are "in-chip" without requiring any intermediate spacing between the planar arrays 75, 76, 77, and 78 for such connections. While the four stages 75, 76, 77, and 78 are shown spaced apart for explanatory purposes, it is understood that they may be in essentially near-abutting relationship in close proximity to each other, i.e., less than one micron apart, e.g., sufficient separation to enable optical transmission rather than reflection between each stage. No deflection of the optical paths—light beams—is needed. Also, it is understood that other types of networks may be used other than the one shown in FIG. 7, for example, a Banyan network.

The operation of the routing of optical signals as indicated in FIG. 7 will be understood by reference to the schematic of FIG. 8 along with FIG. 7. In FIG. 8 there is illustrated the exchanged or crossed over state of the switching action of the nodes 13-13 and 15-13 in stage 1 and the nodes 15-26 and 13-26 of stage 2, i.e., where V1 is less than V2. Thus, impingement of input optical energy $L_1$ to the HPTs in node 13-13 produces current flow in the HPT 13d of node 13-13 which is amplified by current flowing from turned-on bias voltage V2 sufficiently to energize VCSEL 15b in the companion node 15-13, thereby causing $L_1$ to lase from VCSEL 15b as a replica of input $L_1$. Therefore, optical output $L_1$ emitted from node 15-33 serves as input for the HPTs in the stage 2 node 15-26 juxtaposed therebeneath.

When $L_1$ impinges HPTs 15c and 15d in node 15-26, switching occurs because V2 is greater than V1, thereby causing the current in the HPT 15c to be aided by the current from V2 sufficiently to turn on VCSEL 13b in the node 13-26, causing VCSEL 13b to lase with an enhanced replica of $L_1$, as shown. Of course, with V1 turned off, the VCSEL 13b in node 13-11 of stage 1 will not be energized, thereby preventing straight through transmission of $L_1$ via VCSEL 13b.

As will be appreciated from an examination of FIG. 7, the same result applies for those nodes in stage 1 impinged by $L_2$ when V2 exceeds V1. There, $L_2$ will be switched in the exact manner as $L_1$.

Referring further to FIG. 7, when the VCSEL in node 13-26 is turned on, it emits optical output $L_1$ which is passed to the node 13-34 in the next stage 3 of the switching array. In the precise manner as explained in FIG. 8 for stages 1 and 2, the HPT in the node 13-34 of stage 3 is energized to to switch or exchange the path so as to energize the VCSEL in its companion node 15-34 so that $L_1$ is emitted to impinge on the node 13-46 in stage 4—the last stage of the switching network. Because V2 is greater than V1, node 13-46 will be switched or placed in its exchange mode so that its HPT together with V2 energizes the VCSEL in its companion node 15-46 to ultimately pass the light $L_1$ to its final desired output position in the array.

Figure 9:
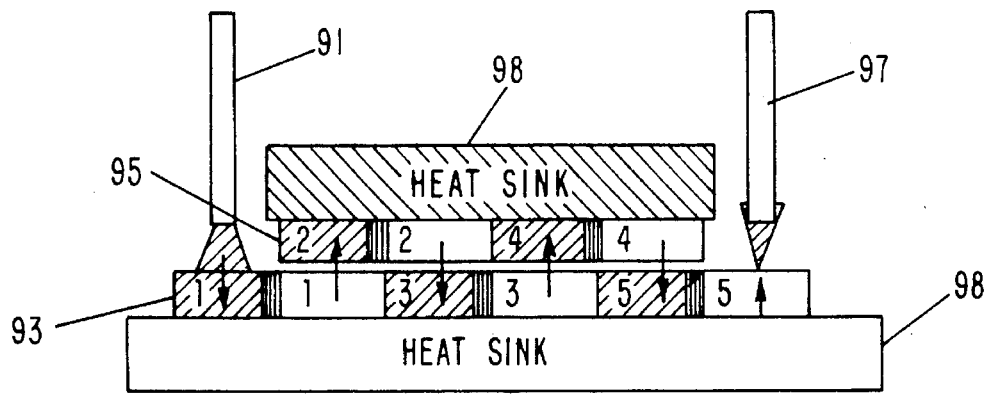
FIG. 9 is a view of an optical bypass/exchange switching network in a coplanar array structure in accordance with an embodiment of the invention.
Figure 10:
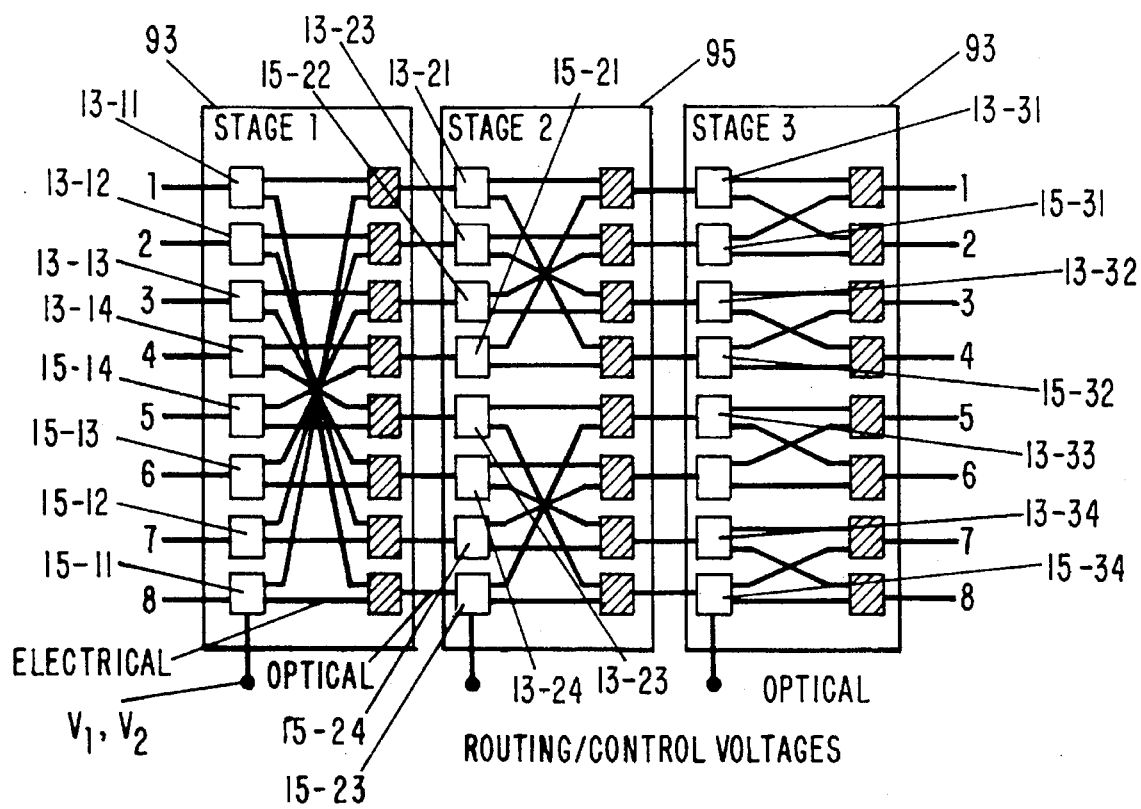
FIG. 10 is a view of an optical switching system in accordance with an embodiment of the invention.
Figure 11:
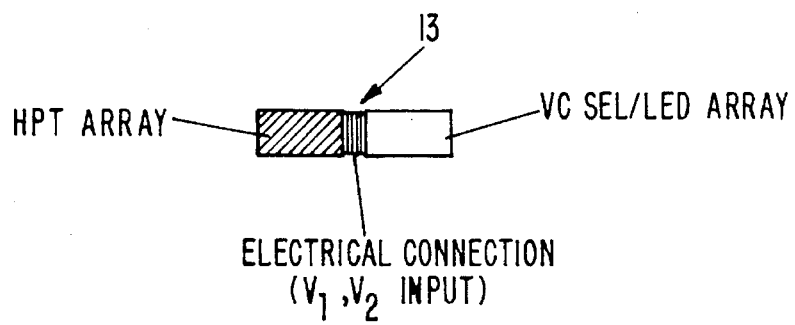
FIG. 11 is a side view of a switching node of FIG. 9.

Reference is now made to FIGS. 9–11 which illustrate another embodiment of the invention wherein there is provided a compact, thin, monolithic, all semiconductor, reconfigurable optical switching system. This is done by compressing and folding the planar array of FIG. 1 into two closely adjacent planar arrays or chips.

As shown in FIGS. 9 and 10, fiber optic input 91 provides input to a first chip or chip portion 93 in a first planar array thereof indicated by the numeral 93a. A second chip or chip portion 95 is located in a second planar array 95a, the arrays being spaced apart from each other by approximately one micron. The planar arrays 93a and 95a may have any desired number of chips or chip portions therein corresponding to the number of desired switching stages labeled "1", "2", "3", "4", and "5" in the Figure. As shown, the optical output of the chip 93 (also labeled "1") is the input for chip labeled 2 in planar array 95a. The output of the chip "2" in array 95a is the input for chip "3" in array 93a, and so forth, there ultimately being an output stage labeled "5" coupled to a fiber optic output 97 which may be located to receive output from the last stage in either the first or second planar array of chips. The input 91 consists of 8 optical signals numbered 1–8 of which signals 1–4 are fed into 4 respective nodes 13-11 to 13-14 and the signals 5–8 are fed into respective nodes 15-14 to 15-11. Each of the nodes 13-11 to 13-14 is identical to the node 13 discussed in connection with FIG. 2 and FIG. 7. These nodes are connected to companion nodes 15-11 to 15-14 (each of which is identical to node 15 discussed in connection with FIGS. 2 and 7) respectively in the manner shown in FIG. 7 for stage 1 of an optical crossover network. Thus, each of the pairs of nodes 13-11 and 15-11, 13-12 and 15-12, 13-13 and 15-13, and 13-14 and 15-14 comprise a bypass/exchange optical switch 11 as described in connection with FIG. 2 but connected node to node across an array as described in connection with FIG. 7.

Each of the nodes 13-11 etc. and 15-11, etc. comprises a pair of HPTs 13c and 13d (FIG. 2) which detect the input optical signals, and an output VCSEL (13b, FIG.2) which is capable of lasing to produce an output optical signal as an amplified replica of whichever input signal under control of the bias control voltages reaches its input terminal with sufficient current to turn it on.

The pairs of HPTs 13c and 13d in each node 13-11, etc. and the pairs of nodes 15c, 15d in each node 15-11, etc. are connected to bias control voltage sources V1 and V2 as explained in connection with FIG. 2 and FIG. 7 so that the optical inputs 1–8 are not switched from their receiving nodes to their companion nodes if V1 exceeds V2, and are switched to their companion nodes if V2 exceeds V1 as explained in connection with FIGS. 2 and 7. All of the connections between the HPTs and the VCSELs in the chip of stage 1 (as well as in stages 2and 3) are electrical and are thus advantageously contained in the plane of the chip.

Stage 2 of the arrangement is on the second chip 95 with nodes connected thereon as shown for stage 2 of FIG.7. Thus, there are nodes 13-21 to 13-24 respectively connected to companion nodes 15-21 to 15-24 in the manner described for stage 2 of FIG. 7 so that whichever optical outputs are emitted from the VCSELs 13b in stage 1 are fed into the HPTs of stage 2.

Likewise, the nodes 13-31 to 13-34 and 15-31 to 15-34 are located on the chip 93 which underlies chip 95 so that its HPTs receive the optical outputs from the VCSELs of stage 2. In this manner, the foregoing and all successive stages, no matter how many, are located on either of the two adjacent chips 93 and 95.

In particular, in accordance with the invention, the HPTs of stage 2 are aligned to overlie the VCSELs of stage 1 in close proximity thereto, and those of stage 3 to underlie the VCSELs of stage 2, so that a space having a depth of only two chips with only a very small (e.g., one micron or less) space therebetween is needed to constitute whatever number of arrays or stages is desired. In this manner, only a minimum of space normal to the planar arrays constituting the stages is occupied. This is best seen in FIG. 9 where the stages are shown as viewed from a side of the arrays or chips 93, 95.

As can be appreciated from in FIG. 9, a depth of only two chips is needed even for a multi-stage array having any number of stages. Referring also to FIG. 11, there is shown a side view of a node with the HPT array portion separated from the VCSEL array portion by the electrical conductive path for control voltages V1 and V2. As indicated earlier, the numerals 1 in FIG. 9 refer to the first stage nodes, the numerals 2, to the second stage nodes, the numerals 3, to the third stage nodes, the numerals 4 to the fourth stage nodes, etc., the ultimate optical output being shown for purposes of illustration as emerging from the VCSELs of the stage numbered 5. Also shown in FIG. 9 are heat sinks 98 and 98a for the respective chips 1 and 2.

Figure 12:
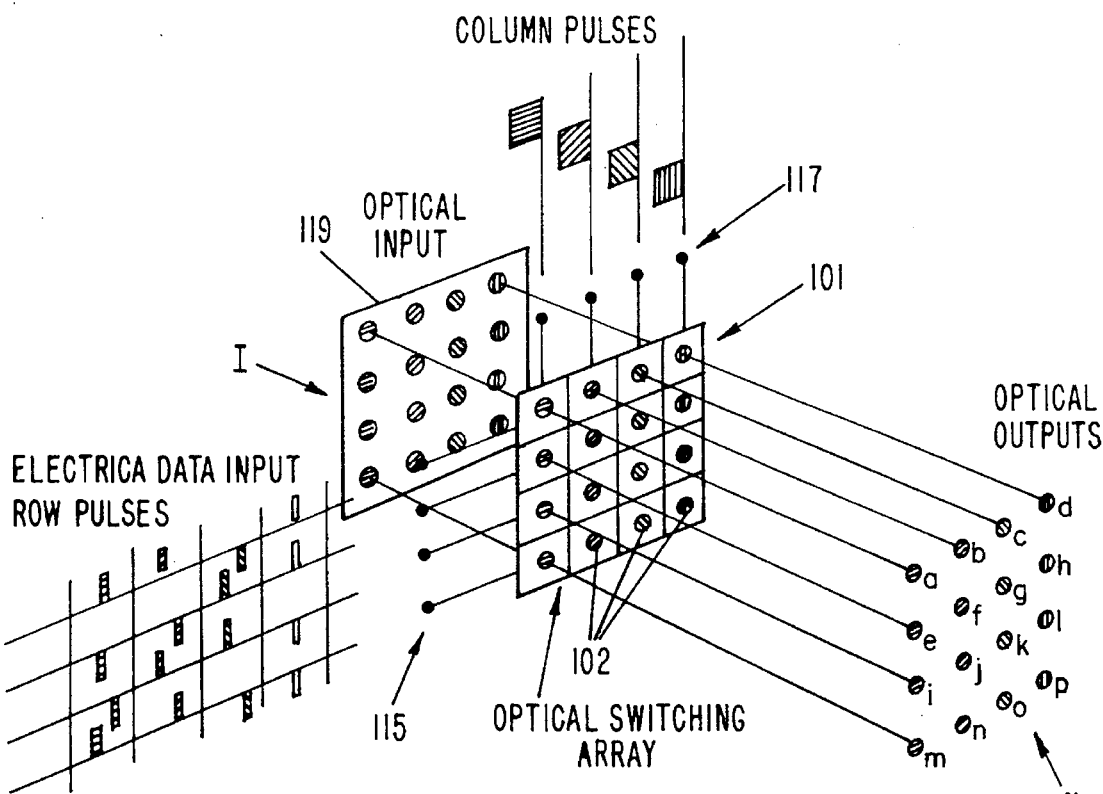
FIG. 12 is a view of an optical signal processing crosspoint switch in accordance with an embodiment of the invention.
Figure 13:
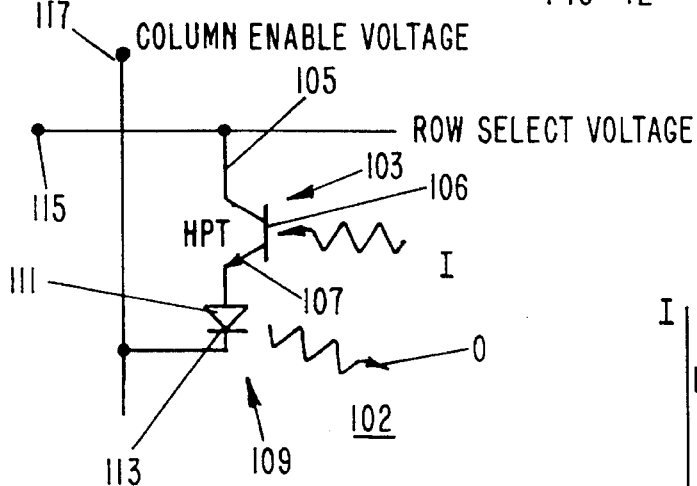
FIG. 13 is a schematic circuit diagram of a biased crosspoint node in accordance with an embodiment of the invention.

Reference is now made to FIGS. 12 and 13 which show a two-dimensional electrical/optical data generator or converter according to another embodiment of the invention. In particular, the data generator of FIG. 12 takes advantage of the cross point switching capability afforded by an arrangement in accordance with an embodiment of the invention whereby nodes are modified or simplified to operate as multi-function cross point switches.

As shown in FIG. 12, there is provided an optical switching array 101 which for purposes of illustration has 4×4 or 16 cross points identified as a, b, c, . . . ,p. At each cross point a through p is a node 102 which, as shown in FIG. 13, includes an HPT 103 having a collector 105, base 106, and emitter 107, and a VCSEL 109 having a p-doped portion 111 and an n-doped portion 113.

The collector 105 is connected to a source of bias control voltage or data input pulses 115, this voltage being designated as the row input pulses. The n-terminal of the VCSEL is connected to a source of bias control voltage or column pulses 117 designated as the column enable pulses. As shown in FIG. 13, under the appropriate conditions of the row input pulses 115 and the column enable pulses 117, the presence of an optical input signal I from positions a–p in source 119 impinging on the base 106 will cause the HPT to become conductive and feed current from its collector 107 to the p-junction 111 of the VCSEL 109, thereby causing the VCSEL to lase with its output signal N being a replica of the input signal I as gated column enable pulses 117 and modified by row input pulses 115.

For instance, the presence of input I on base 106 may cause current to flow in the HPT 103 from the emitter 107 to the p-junction 111 of the VCSEL 109, but that current by itself is insufficient to bias the VCSEL to its "on" condition. However, if there is sufficient voltage from row pulse source 115 appearing on the collector 105, then sufficient current may be generated in the HPT 103 to bias the VCSEL 109 if the VCSEL 109 is biased to its on condition by the presence of a column enable pulse 117. thereby enabling emission of optical output N.

In addition, the presence or absence of the column enable pulses 117 may be used to further control the node so that VCSEL 109 may be latched to its on condition by the voltage 117 in the absence of further row pulses 115. Also, the pulses or voltage 117 may be used as an on off switch for one or more columns of the array, whereby only those nodes at the cross points in the activated columns can be turned on.

Thus, the node 102 can operate as either a latching switch or as a threshold switch. With a node 102 located at each cross point of the array 101, and with a source of 16 optical input signals 119 providing a different input signal I to each of the nodes, the optical inputs I can be controlled by either or both of the voltages or pulses 115 or 117 to provide various combinations of output signals N. For example, the arrangement of FIG. 12 enables control or modulation of the input optical signals I so that some or all are changed in accordance with particular input electrical voltages introduced, say, as row pulses 115 representing electrical data signals. In addition, the production of output pulses, e.g., an on or off condition, may be further controlled as a function of the column enable voltage 117. As shown in the graph of FIG. 14, the column enable voltage 117 may be used as a holding or latching voltage biasing the VCSEL to an on condition even though the row pulse is no longer present to serve that purpose.

Figure 14:
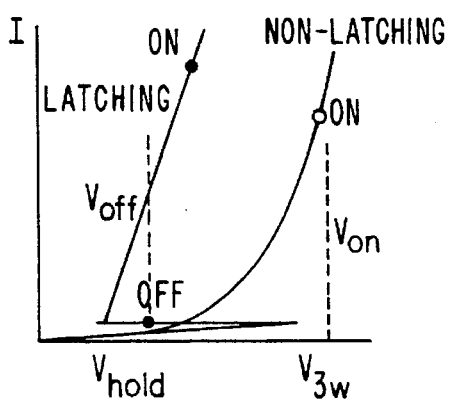
FIG. 14 is a current vs voltage graph explaining the operation of the crosspoint nodes shown in FIGS. 12 and 13.

Further, the arrangement of FIGS. 12–14 may also be employed as an analog to digital converter with either the electrical or optical input signals being the one to be converted to digital. For example, if the optical inputs 119 are the analogs, the row voltages 115 may adjusted to provide a threshold controlling the on off conditions of the VCSELs. Alternatively, the optical inputs may be used as the threshold controls for analog electrical signals in the rows.

Also, the arrangement in FIGS. 12–14 and as further shown in FIG. 15 may serve as a time division multiplex switch to convert parallel inputs into serial outputs. In this mode, the column enable voltage 117 may take the form of timing pulses to enable each column in timed sequence, and the row select voltage 115 may take the form of pulses enabling the node in each row in timed sequence, so that there is provided a scan column-wise and row-wise, e.g., vertically and horizontally, of the optical input I and output pulses N whereby they can be serialized in to channels column by column, row by row, or array-wise.

Other switching, modulation, and multiplex arrangements in accordance with the invention are explained in connection with FIGS. 15–17. Such arrangements may serve as a pulse generator or multiplexer providing a train of optical output pulses at a substantially higher pulse rate than inputted from the source. This is done by utilizing the multi-channel optical interconnection network of the invention so that it acts as a time division multiplexer for a given number of channels whereby pulses from neighboring channels are time delayed and interleaved serially to achieve a much higher overall pulse rate in a serial output. Thus, if the pulse rate in each channel is, say-4 GHZ, by interleaving the pulses from, say, 16 channels each having a pulse rep rate of 4 GHZ, a serial pulse rate of 64 GHZ can be achieved. In short, if the incoming pulse rep. rate in each channel is X and the number of channels is Y, the pulse rep. rate can be increased to XY.

As shown in FIG. 15, 16 optical pulse inputs labeled a, b, c, etc. from a source 119 are fed to a an array 121 of cross points A, B, C, etc., the input from a being fed to cross point A, b to B, etc. Each cross point consists of either an appropriately biased VCSEL or a node comprising an HPT and a VCSEL. Thus, there is one VCSEL or one node at each cross point A, B, C, etc. of the array 121 corresponding to each of the 16 optical inputs a, b, c, etc.

Considering first an alternative where in accordance with the invention each of the cross points A, B, C, etc., of the array 121 comprises only a VCSEL (and not a VCSEL together with an HPT to provide a switching node—which will be discussed later), advantage is taken of the fact that the lower the voltage bias level below the threshold bias level required to enable lasing of a VCSEL, the longer it takes for an arriving pulse to charge up the laser cavity in the VCSEL to the bias level to enable lasing, i.e., the threshold point. Therefore, by placing a predetermined bias of level less than the threshold bias level (hereinafter referred to as "prebias"), that is, by prebiasing the cross points A, B, C, etc. to different levels from each other, all of the levels being below the threshold, each burst of lasing pulse which is enabled by a common optical pulse input and transmitted from the VCSEL at each cross point can be made to occur at a time slightly different from the burst at each other cross point. The lower the pre-bias level, the longer it takes for an enabling combination of optical and bias or switching control voltage pulses to charge up the VCSEL to its threshold or lasing level. Thus, the extent of prebiasing determines the extent of delay of an output pulse from a VCSEL for the purpose of timing the output pulse of that device. If the cross points A, B, C, etc. each have a different time slot for their output pulses, a pulse train may be established in which pulses incoming to the VCSELs at 4 GHZ can be stepped up to a rate of 64 GHZ, i.e., a multiple of 16 afforded by the 4×4 cross point network.

Accordingly, as shown in FIG. 15, there is provided for the array 121 a plurality of column voltage bias control sources 123p, 123r, 123s, and 123t and a plurality of row bias control voltage sources 125p, 123r, 123s, and 123t. It is to be understood that each of the column and row bias control sources may be connected individually to each of the cross points A–P in the manner shown and described in connection with FIG. 13 to provide pulses of predetermined same or different voltages to each VCSEL at the cross points A–P. Therefore, by providing a distinct, different voltage bias from each of, say, the column or row bias control sources 123p, etc. or 125p, etc., or both, the bias on the VCSELs at each cross point A–P may differ from each other by predetermined amounts so as to require different predetermined pulse voltages based on combinations of pulse voltages to turn on the VCSELs. Since voltage build up time is proportional to current, current may be employed to control time delay.

This amount of delay is diagrammatically illustrated by the varying lengths of the arrows A1 through P1 emanating from each of the cross points A–P. Consequently, the timing of a pulse produced by the lasing of the VCSEL at cross point A would occur earlier than the pulse from B which in turn is earlier than the pulse from C, etc. Thus, the incoming pulse from the input path b in source 119 at 4 GHZ reaching cross point B receives a time slot slightly delayed from the 4 GHZ pulses from input path a reaching cross point A, and so on, so that the time slot or "space" between each 4 GHZ pulse is filled by the pulses from the other 15 channels—paths b, c, d, e, before another 4 GHZ pulse from input path b reappears. This is further illustrated in FIG. 17 wherein the window outlined in broken line represents the time between two adjacent incoming pulses a, $\Delta T_1$ is the time interval for the output pulses in groups of four produced by each row, and $\Delta T_2$ is the time separation between two adjacent output pulses such as a and b.

The output pulses from each of the cross points may then be fed optically to an output array 127 or otherwise directly to a GRIN lens or any other suitable well known focusing element 129 to bring the pulses into focus for serial propagation in any appropriate manner such as via an optical fiber 131.

Thus, it will be appreciated that optical input pulses from each channel a, b, c, etc. of input source 119 at a pulse repetition rate of, say, 4 GHZ can, by multiplex interleaving as explained above with 4 GHZ pulses successively staggered from the other channels, be transformed into output serial pulses at a 16×4 or 64 GHZ rate.

Figure 17:
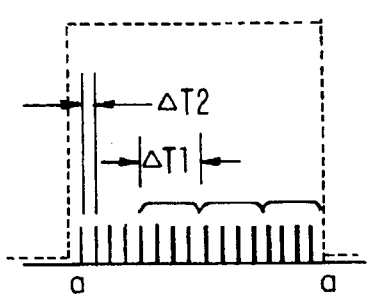

Referring further to FIG. 15 in connection with FIGS. 16 and 17, it will further be appreciated that according to the invention each of the VCSELs at the cross points may be gain-switched by a combination of optical and electrical pulses. That is, pulses and no-pulses from the column sources 123p, r, s, t may be timed in any suitable well known manner to combine with each pulse or "no pulse" in channels a, b, c, etc from source 119 to reach each cross point A, B, C, etc. simultaneously.

For example, as indicated in FIG. 15, the channel a in input array or source 119 has a no-pulse or "off" condition as indicated by the white dot. The "on" condition is indicated by a black dot. If a pulse of sufficient intensity from source 123p arrives at cross point A to turn on the VCSEL thereat, channel a would be switched or modulated from a no-pulse or "off" to a pulse or "on" condition and would be represented in the output array 127 by a black dot. Conversely, if a channel such as c in the input array 119 is active as indicated by the black dot therein but the VCSEL at cross point C in the network 121 requires an intensity higher than that afforded by the pulse in the channel c, then the VCSEL in that channel will not be turned on to pass through the pulse in channel c to the output array unless a pulse of sufficient intensity from column source 123s arrives simultaneously at cross point C. Thus, a no-pulse condition on 123s will serve to turn off channel c, and a pulse thereon will turn it on.

Referring further to FIG. 15, in the alternative where there is a node—an HPT coupled to a VCSEL—at each cross point A, B, C, etc., further flexibility is enabled. Included in this embodiment is the variation shown in FIG. 15A wherein an electrical voltage is provided via a lead 137 to the base terminal of an HPT 135 which, except for this connection, is identical to the HPT 103 shown in FIG. 13. This enables placing an electrical prebias voltage on the HPT. Thus, when the HPT-VCSEL combination of FIG. 15A is placed at each cross point of the network 121, each HPT may be independently prebiased via the base terminal connection 137 from a plurality of sources 133p, 133r, 133s, and 133t. Thus, at each cross point a different bias voltage can be applied to each HPT to thus effectively prebias the VCSEL at a different level below lasing threshold. The unmodulated short pulses from sources 123p, 123r, etc. may be employed to gain switch the VCSELs. Data may then be applied from either the row sources 123p, 123r, etc. or from the optical inputs a, b, c, etc. from the optical source 119. As another variation here, delays may be controlled by the bias voltages on the HPTs with a constant row-column voltage across the nodes, thereby enabling the input optical data from a, b, c, etc. from source 119 to gain switch each of the VCSELs above or below threshold in accordance with the data content.

With the HPT-VCSEL arrangement shown in FIG. 15A connected to the prebias sources 133p, 133r, etc., the row enable sources 125p, 125r, etc., and with the VCSELs connected as shown in FIG. 13 or FIG. 15A to the column enable sources 123p, 123r, etc. thereby producing the arrangement as shown in FIG. 15, there is also provided a time-division multiplex arrangement enabling analog or digital pulse modulation. Each of the column sources of bias voltage 123 p,r,s,t is connected to the n-doped portion 113 of the VCSEL (see FIG. 13) to enable the sequential scanning of the columns A,E,I,M; B,F,J,N; etc. at their cross points. That is, the VCSELs are biased so as to not produce a laser output unless triggered by the column enable pulses from sources 123p, 123r, etc.

Input data in the form of binary pulses—pulses or no-pulses—are applied in parallel along the row cross points to the collector terminal 117 of each HPT. By appropriate adjustment of the prebias voltages from the sources 133p. 133r, 133s, and 133t, as explained earlier, the HPTs in each row of 4 nodes at the cross points are biased differently from each other so that they are enabled at times different from each other, e.g., in the same manner as in the case of the VCSELs as earlier described. That is, the lower the prebias voltage below threshold, the more time required to build up to the enabling or threshold voltage of the HPT, thereby permitting adjustable delays. Thus, as each column is scanned over a period $\Delta T_1$ as shown in FIG. 17, the HPTs at the cross points A, B, C, etc. are sequentially fired at time periods $\Delta T_2$ because of a different delay-inducing prebias on each one, and each HPT puts out either a pulse or a no-pulse depending on the data fed to the collectors thereof from row sources 125p, 125r, etc.

For example, each of the HPT's 135 is enabled to produce a pulse or no pulse as follows. First, assuming there is an optical pulse input in channel c of source 119, this pulse, indicated in FIG. 15A by the arrow I, along with prebias voltage, energizes the HPT 135 to a level whereby, with the addition of a row enabling pulse from source 115 (e.g., one of the sources 125p in FIG. 15) at collector 105, will energize the HPT to produce an output pulse at emitter 107. This output pulse is of sufficient voltage so that, in combination with a pulse from the column enable source 117 (e.g., source 133p in FIG. 15), will cause the VCSEL 109 to lase, thereby providing an optical pulse output. Thus, in this mode, the input optical pulse in channel c has not been not changed or modulated.

Of course, if it is desired to change the input optical pulse into an output "no pulse" this can be accomplished by providing a "no-pulse" from the row enable source, thereby reducing the bias to a level below that necessary to trigger the HPT and preventing the production of an output pulse on emitter 107 of the HPT 135, thus, disabling VCSEL 109.

In the case where it is desired to change a "no pulse" optical input, say in channel a as indicated in FIG. 15, to an output optical pulse as shown in the output array 127 of FIG. 15, the row enable pulse is adjusted to provide the necessary bias to collector 105 of the HPT 135 to turn on the HPT in the absence of optical input energy thereto. All of the row enable pulses should preferably have a voltage sufficient, in combination with the prebias voltage, to turn on the HPT whether or not an input optical pulse is present. In this manner a "no-pulse" optical input can be changed to an optical pulse output by the application of a row enable pulse to the cross point—cross point A in this instance. Of course, if it is desired to pass a no pulse input through as a no pulse output, then a row enable "no pulse" is applied to the appropriate cross point, for example, as indicated for channels b and d.

The outputs of the cross points A, B, C, etc. will thus be either pulses or no pulses each in a time slot identifying the channel a, b, c, etc. established in the input array 119.

The outputs of the cross point network 121 may be passed through the output array 127 and collected through a suitable lens for transmission as serial pulse trains via fiber 131. Thus, for example, in this embodiment, input optical pulses and "no pulses" as respectively represented by the black and white dots in the input array 119 are processed through the cross point array 121 into output pulses and "no-pulses" as represented by the black and white dots in the output array 127. In terms of pulse trains, referring to FIG. 16, pulse train A represents in serial form the pulses and no pulses at input array 119, and pulse train B represents in serial form the pulses and "no pulses" arriving at output array 127 and collected in fiberoptics 131.

It will be appreciated that in accordance with the invention the employment of the prebias voltage for each of the HPTs at the cross points enables the convenient setting of bias levels for the HPTs enabling the use of the row enable pulses (i.e., the data or modulating information) to effectuate changes of input optical data or pulses at the cross points from "pulse" to "no pulse" and vice versa.

Figure 18:
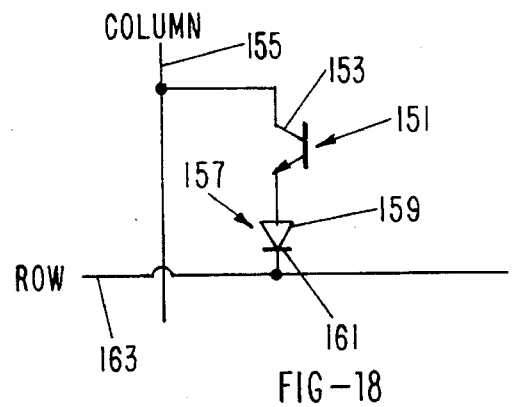
FIGS. 18 is a schematic circuit diagram of a crosspoint switch according to another embodiment of the invention.

Reference is now made to FIGS. 18–21 which relate to another embodiment of an optical cross point switching array arranged for column scanning employing forward biasing of its series connected HPT-VCSEL components. This particular arrangement provides a non-latching switch which can convert a linear array of words or other stored electrical data into a two dimensional array of optical signals. As shown in FIG. 18, the switch to be located at each cross point of the array includes a phototransistor or HPT 151 with its collector 153 connected to a source of column enable pulses or positive bias voltage 155 and its emitter connected to VCSEL 157 at its p-doped terminal 159. The n-doped terminal 161 of VCSEL 157 is connected to a source of row signal pulses or negative bias voltage 163.

Figure 19:
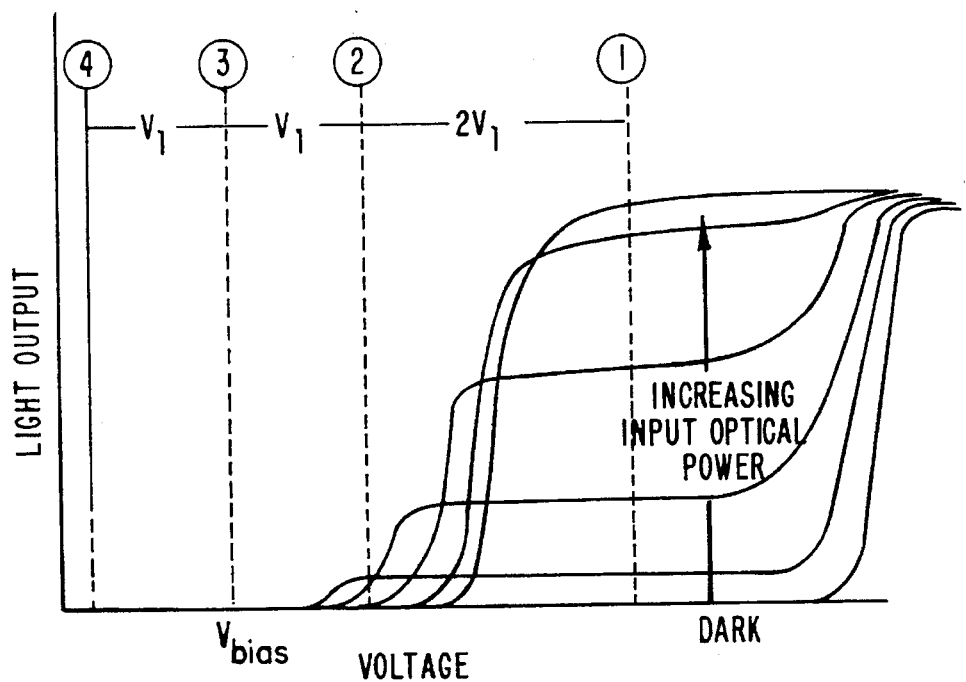
Figure 20:
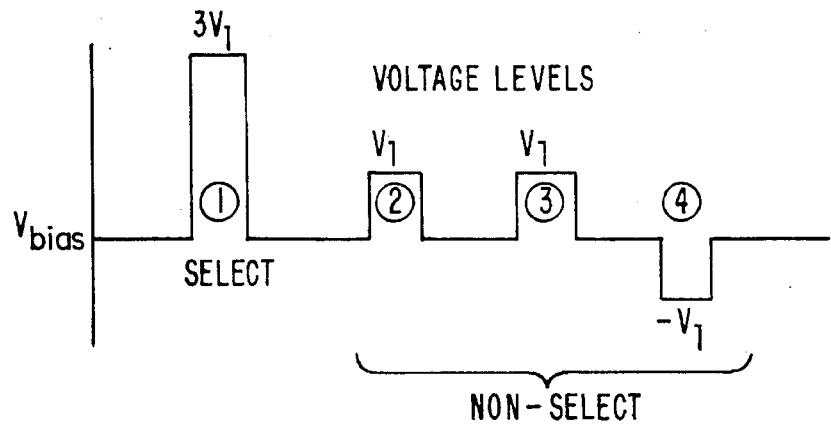

Referring to FIGS. 19, 20, and 21, the voltage difference between the column and row pulses during any instant of time determines whether or not a particular element or switch of the array is selected or turned on, i.e., to cause its VCSEL to lase. As indicated in FIGS. 20 and 21, the VCSEL 157 will lase (selection made) when the bias across the switch—HPT 151 and VCSEL 157—is 3V1. This is made to occur when a column scanning pulse of voltage level 2V1 is applied from source 155 to the collector 153 of HPT 151 simultaneously with optical input excitation of the HPT at an appropriate level above dark current and the application of a negative information pulse of level −V1 or greater negative value from row source 163 to the n-doped terminal 161 of VCSEL 159.

Also, as shown in FIG. 19, a grey scale capability is available with the arrangement of FIG. 18. That is the intensity of light output of VCSEL varies in accordance with the amount of voltage or optical input power fed to HPT 151. Of course, instead of the HPT acting as a two terminal device, a three terminal device such as a heterojunction bipolar transistor (HBT) having a base terminal may be employed so that electrical excitation of the base terminal rather than optical excitation may be used.

Turning to FIGS. 22–25, there is shown in FIG. 22 a cross point switch 170 employing a photothyristor instead of a phototransistor in series with a VCSEL. This provides a bistable switch with latching capability. As shown, a source 169 of column enable scanning voltage or bias +V1 is fed to a photothyristor 171 at its p-doped terminal 173. The photothyristor 171 is a bistable device and has and has an optical memory. The output of the photothyristor is fed from its n-doped terminal 175 to a VCSEL 177 at its p-doped terminal 179. A source 181 of row information pulses or negative bias of at least −V1 is applied to the n-doped terminal 183 of the VCSEL. In addition, a constant bias voltage $V_b$ is applied across the switch 170 from sources 169 and 181.

As shown in FIGS. 24 and 25, the combination of row and column voltages applied across each cross point switch, i.e., across the devices 171 and 177, are chosen such that a 2:1 selection scheme is in effect, although other ratios may be employed. That is, with a row voltage of −V1 and a column voltage of +V1, the switch will have a voltage differential of 2V1 applied across it. As indicated in FIG. 23, when the voltage 2V1 exceeds the threshold voltage $V_s$, this enables production of sufficient current from the photothyristor in the switch to turn on the VCSEL causing it to be in its "on" state, i.e., to lase.

The photothyristor itself is an electrically bistable element with a resistive state and a conducting state which switches from the former to the latter when the switch bias voltage exceeds the threshold value $V_s$. As discussed, the select voltage level above $V_s$ is 2V1. The photothyristor 171 will be latched to the conducting state unless the switch bias falls below a fixed holding voltage level $V_h$. It is also the electrical switching of the photothyristor 171 that produces the current source that turns on the VCSEL 177. Consequently, the switch 170 exhibits the same threshold, latching, and holding characteristics as the photothyristor, with a bistable region between the holding voltage level $V_h$ and the switching voltage threshold level $V_s$ as indicated in FIG. 23.

As indicated in FIG. 23, the constant bias voltage $V_b$ biases the switch into its bistable region at a sufficient level so that superimposition of the voltage 2V1 thereon will switch the VCSEL 177 to its "on" state. In this condition the current produced by the photothyristor causes the VCSEL to lase. When the 2V1 select pulse or voltage differential expires or is turned off, the photothyristor nevertheless remains in its conducting bistable condition causing the VCSEL 177 to remain in its lasing condition. Thus, after the switch is turned on, it will remain turned on—latched to the lasing level for the VCSEL—even though the 2V1 voltage is absent so long as the voltage bias on the switch remains above $V_h$.

For the non-select voltage combinations, a pulse modulation of +V1 or −V1 of a level between $V_h$ and $V_s$ will leave the switch in an unchanged state. Thus, each column of selected switching elements will be gated in its respective time slot in accordance with the row select data pulses, and the VCSEL outputs are latched while the successive columns are addressed. Thus, an entire two-dimensional array of optical outputs can be maintained while the columns are addressed sequentially, producing a two-dimensional optical data source in real time. The entire array may be erased frame by frame by reducing the switch bias voltage below $V_h$.

It is understood that while several embodiments of the invention have been specifically described and shown, other versions and embodiments in accordance with the invention may occur to and be practiced by those skilled in the art, the scope of the invention being limited only by the following claims.

I claim:

1. An electro-optic device comprising:
   a) a substrate;
   b) first lasing means including plural stacked layers on the substrate;
   c) second means for producing electrical current responsive to radiation impinging thereon located on said substrate and horizontally displaced from said first lasing means, said second means having plural stacked layers, said stacked layers being physically, electrically and optically isolated from said first laser means;
   d) third means electrically connecting said first and second means,
   whereby in response to a predetermined level of radiation impinging on said second means, sufficient current may be produced in said second means to pass through said third means to provide sufficient bias to enable said first means to lase.

2. The device of claim 1 further comprising:
   e) voltage biasing means electrically connected to a layer of said second means for controlling the output of said second means.

3. The device of claim 1 further comprising:
   e) voltage biasing means electrically connected to a layer of said first means,
   whereby said voltage biasing means provides a bias voltage for controlling the level at which said first means lases.

4. The device of claim 2 further comprising:
   f) further voltage biasing means electrically connected to a layer of said first means,
   whereby said second voltage biasing means provides a bias in addition to that provided by said first voltage biasing means for controlling the voltage bias level at which said first means lases.

5. The device of claim 2 further comprising:
   f) further voltage biasing means connected to a layer of said second means for further controlling the level and the time required for reaching that level at which said second means produces an output.

6. The device of claim 3 further comprising:
   f) further voltage biasing means connected to a layer of said second means for further controlling the level and the time required for reaching that level at which said second means produces an output.

7. The device of claim 4 further comprising:
   g) yet further voltage biasing means connected to another layer of said second means for further controlling the level and the time required to reach that level at which said second means produces an output.

8. The device of claim 1 wherein said first lasing means comprises a vertical cavity surface emitting laser having differently doped input and output terminals.

9. The device of claim 1 wherein said second means comprises a photothyristor.

10. The device of claim 1 wherein said second means comprises a heterojunction phototransistor wherein the stacked layers extending from the substrate thereof are respectively the emitter, base, and collector terminals.

11. The device of claim 1 wherein said first means comprises first and second vertical cavity surface emitting lasers each having a first and second differently doped layer, said second means comprises first and second pairs of heterojunction phototransistors, each heterojunction phototransistor having a first, second, and third doped layer, the conductivity between said first and second doped layers of each said phototransistor being responsive to radiation impinging thereon, and said third means comprises: a first pair of conductors respectively connecting the third doped layer of one of each pair of heterojunction phototransistors to the first doped layer of each vertical cavity surface emitting laser, and a second pair of conductors respectively connecting the third doped layer of the other of each pair of heterojunction transistors to the first doped layer of each vertical cavity surface emitting laser.

12. The device of claim 11 further including first voltage biasing means comprising one source of bias voltage connected to the first doped layer of one of each pair of heterojunction phototransistors and another source of bias voltage connected to the first doped layer of the other of each pair of heterojunction phototransistors.

13. The device of claim 12 further including second voltage biasing means connected to the second doped layer of each vertical cavity surface emitting laser.

14. An array of several of said optical switching devices of claim 11 for use in rerouting optical signals between a plurality of discrete input positions and a like plurality of discrete output positions, said array structure comprising:
   a) support means;
   b) a plurality of electrically conductive internodal paths located on said support means;
   c) a plurality of switching nodes located on said support means, each switching node being associated with a respective one of said plurality of discrete input positions for receiving an associated optical input signal therefrom, and further, each of said switching nodes comprising:
      1) input means for selectively converting its associated optical input signal into either a first or a second electrical signal each representative of said optical input signal, said input means being connected to one of said internodal paths to carry the second electrical signal, when selected, to another switching node;
      2) output means associated with said input means for converting a selected one of either the first or the second electrical signals into an optical output signal, said output means being connected to another of said internodal paths for producing, in response to a second electrical signal selected and produced by the input means of another switching node, an optical signal associated with the optical input signal of said other switching node;
      3) an internodal conductive path within the switching node electrically connecting said output means to the input means to carry said first electrical signal when selected to said output means for producing an optical output signal corresponding to its associated optical input signal.

15. The array structure of claim 14 wherein the input means comprises first and second heterojunction phototransistors for respectively producing said first and second electrical signals, and the output means comprises a vertical cavity surface emitting laser, said interanodal conductive path connecting said first heterojunction transistor to said vertical cavity surface emitting laser.

16. A multiplicity of said array structures of claim 14 forming a multi-stage routing network, wherein the support means is a multiplicity of overlaying planar bodies having spaces therebetween of distance limited in smallness only to the extent to prevent interface reflection of optical signals, each planar body supporting a like plurality of said switching nodes of claim 14 whereby the optical output signals of the switching nodes of each planar body closer to the optical input signals act as the optical input signals for the succeeding plane.

17. The array structure of claim 16 wherein the input means in each switching node comprises a pair of heterojunction phototransistors for respectively producing said first and second electrical signals, and said output means comprises a vertical cavity surface emitting laser, said internodal conductive path connecting said first heterojunction transistor to said vertical cavity surface emitting laser, and said internodal path being connected to said vertical cavity surface emitting laser from the input means of a another switching node.

18. The array structure of claim 17 wherein the support means comprises a plurality of overlying planar bodies, the vertical cavity surface emitting lasers in the switching nodes in the planar body closest to the optical input signals providing optical output signals which serve as optical input signals for the heterojunction phototransistors of the switching nodes in the succeeding planar body, the vertical cavity surface emitting lasers of the switching nodes in said succeeding planar body providing optical output signals which serve as optical input signals for the heterojunction phototransistors of the switching nodes of the next succeeding planar body, and so on, the optical output signals of the vertical cavity surface emitting lasers of the last planar body constituting the optical output signals of the array structure.

19. The array structure of claim 17 arranged in first and second overlying planes having a space therebetween, said first plane being comprised of a first plurality of odd numbered groups of switching nodes and said second plane being comprised of a second plurality of even numbered groups of switching nodes, the first odd-numbered group of switching nodes in said first plane constituting a first switching stage in which the heterojunction phototransistors of each switching node are positioned to receive the optical input signals, the vertical cavity surface emitting laser of each switching node in said first stage being located adjacent to its associated heterojunction phototransistor, the first even-numbered group of switching nodes in said second plane constituting a second switching stage wherein the heterojunction phototransistor of each switching node thereof is positioned in registration with a vertical cavity surface emitting laser of said first odd-numbered group of switching nodes to receive therefrom as their optical input signals the optical output signals produced by said vertical cavity surface emitting lasers, the next odd numbered group of switching nodes in said first plane constituting a next switching stage wherein the heterojunction phototransistor of each switching node thereof is positioned in registration with a vertical cavity surface emitting laser of switching node of the previous stage whereby the optical output signals produced by the vertical cavity surface emitting lasers of the previous stage become the optical input signals for the heterojunction phototransistors of the switching nodes in the next switching stage, and so on, there being a last switching stage wherein optical output signals produced by the vertical cavity surface emitting lasers thereof constitute the output signals of the array structure.

20. The array structure of claim 19 wherein the dimension of said space is such that said first and second planes are not in intimate physical contact.

21. The array structure of claim 19 further comprising means for dissipating heat produced by the switching nodes.

22. The array structure of claim 14 wherein the input means of each of said switching nodes further comprises first and second voltage biasing means for selecting said first and second electrical signals.

23. The array structure of claim 18 wherein said input means of each of said switching nodes further comprises first and second voltage biasing means for selecting said first and second electrical signals.

24. A plurality of array structures as recited in claim 14 arranged in tandem whereby the output optical signals of one array structure constitute the optical input signals of the next such array structure.

25. The plurality of array structures set forth in claim 24 wherein the number constituting the plurality of tandem array structures in relation to the number of discrete positions for optical input signals is sufficient to enable any optical input signal reaching the first array structure in a discrete position to be rerouted to any other position as an optical output signal emerging from the last array structure.

26. An array of several of said optical switching devices of claim 1 for selectively processing a plurality of optical input signals each occupying a discrete location in an input array comprising:

a) a plurality of first means arranged in an array, each of said first means having a position in the array corresponding to the location of one of said optical input signals in the input array, each of said first means intercepting one of said optical input signals and, with application of a bias voltage thereto, translating said optical input signal into an output electrical signal representing the optical input signal;

b) a plurality of second means arranged in an array corresponding to said plurality of first means, there being one second means for and associated with each first means, each of said second means comprising an electrically activatable optical signal-producing means;

c) an electrically conductive path for carrying said output electrical signal connecting each of said second means to its associated first means, each of said second means producing, in response to said bias control voltages producing said output electrical signal, an optical output signal representing the optical input signal as located in the input array, and, in response to insufficient bias control voltage applied to said first means, no optical output signal for that location in the input array.

27. The array of claim 26 including electrical voltage biasing means coupled to each of said second means to hold any of said second means in an optical signal output-producing mode in the absence of application of said output electrical signal thereto.

28. The array of claim 26 including means for producing a bias control voltage coupled to each of said first means to trigger each of said means to an on condition at different times to thereby enable production of respective outputs from said first means in respectively different time slots.

29. The array of claim 26 including pre-biasing means coupled to each of said first means so that each of said first means may be biased to produce an electrical output signal at a time different from the signal output of every other one of said first means, each signal occupying a unique time slot.

30. The array of claim 27 including pre-biasing means coupled to each of said first means so that each of said first means may be biased to produce an electrical output signal at a time different from the signal output of every other one of said first means, each signal occupying a unique time slot.

31. The array of claim 28 including pre-biasing means coupled to each of said first means so that each of said first means may be biased to produce an electrical output signal at a time different from the output of every other one of said first means, each signal occupying a unique time slot.

32. The array of claim 26 wherein each of said first means comprises a heterojunction phototransistor and each of said second means comprises a vertical cavity surface emitting laser.

33. The array of claim 26 further comprising means to collect and convert said optical output signals into a serial train thereof.

* * * * *